US008941289B2

(12) United States Patent
Hirabayashi et al.

(10) Patent No.: US 8,941,289 B2
(45) Date of Patent: Jan. 27, 2015

(54) POWER GENERATION UNIT, ELECTRONIC APPARATUS, TRANSPORTATION DEVICE, AND METHOD OF CONTROLLING POWER GENERATION UNIT

(75) Inventors: Atsuya Hirabayashi, Chino (JP); Kunio Tabata, Shiojiri (JP); Atsushi Oshima, Shiojiri (JP); Hiroyuki Yoshino, Suwa (JP); Noritaka Ide, Shiojiri (JP); Yasuhiro Ono, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 369 days.

(21) Appl. No.: 13/619,729

(22) Filed: Sep. 14, 2012

(65) Prior Publication Data
US 2013/0082569 A1    Apr. 4, 2013

(30) Foreign Application Priority Data
Oct. 3, 2011   (JP) .................. 2011-219034

(51) Int. Cl.
*H01L 41/113*   (2006.01)
*H02N 2/18*     (2006.01)

(52) U.S. Cl.
CPC ............ *H01L 41/1136* (2013.01); *H02N 2/181* (2013.01); *H02N 2/188* (2013.01)
USPC ....................................... 310/339

(58) Field of Classification Search
USPC ................................. 310/338, 339
See application file for complete search history.

(56) References Cited

U.S. PATENT DOCUMENTS

| 5,552,656 A | 9/1996 | Taylor |
| 5,801,475 A | 9/1998 | Kimura |
| 6,252,336 B1 | 6/2001 | Hall |
| 6,522,048 B1 | 2/2003 | Burns et al. |
| 8,026,650 B2 | 9/2011 | Ramadass et al. |
| 8,368,290 B2 | 2/2013 | Kwon et al. |
| 8,373,332 B2 | 2/2013 | Lee |
| 2010/0102782 A1 | 4/2010 | Thiesen et al. |
| 2012/0068576 A1* | 3/2012 | Lee ............................. 310/339 |
| 2012/0119618 A1 | 5/2012 | Tabata et al. |
| 2012/0126666 A1 | 5/2012 | Tabata et al. |
| 2012/0212101 A1 | 8/2012 | Tabata et al. |
| 2013/0082571 A1 | 4/2013 | Tabata et al. |

FOREIGN PATENT DOCUMENTS

| JP | 07-107752 A | 4/1995 |
| JP | 2003-218418 A | 7/2003 |

(Continued)

OTHER PUBLICATIONS

E Lefeuvre et al., "A comparison between several vibration-powered piezoelectric generators for standalone systems", Sensors and Actuators A: Physical, vol. 126, Issue 2, Feb. 14, 2006, pp. 405-416.

*Primary Examiner* — Derek Rosenau
(74) *Attorney, Agent, or Firm* — Maschoff Brennan

(57) ABSTRACT

A power generation unit includes: a deforming member adapted to deform while switching a deformation direction; a piezoelectric device provided to the deforming member, and having a pair of electrodes; a displacement sensor adapted to detect a deformation amount of the deforming member, and then output deformation amount information as information related to the deformation amount; an inductor electrically connected to the piezoelectric device; a switch disposed between the piezoelectric device and the inductor; and a switch control section adapted to control the switch so as to set the pair of electrodes to a shorted state for a predetermined period of time when the deformation amount exceeds a predetermined level.

20 Claims, 12 Drawing Sheets

(56) References Cited

FOREIGN PATENT DOCUMENTS

| JP | 2005-312269 | A  | 11/2005 |
| JP | 4811537     | B1 | 11/2011 |
| JP | 4835888     | B1 | 12/2011 |
| JP | 4835889     | B1 | 12/2011 |

* cited by examiner

FIG. 5A
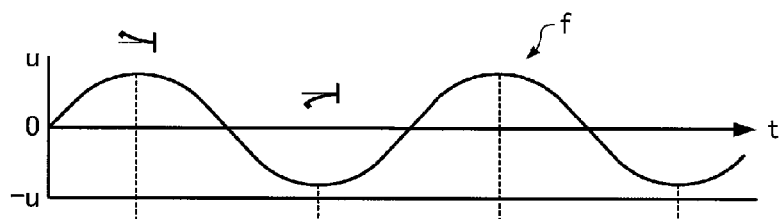
FIG. 5B
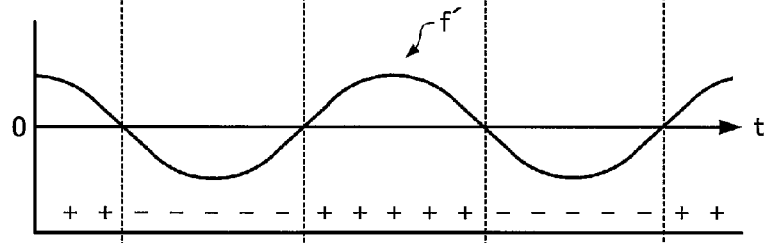
FIG. 5C
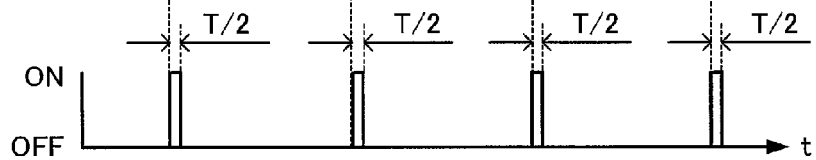
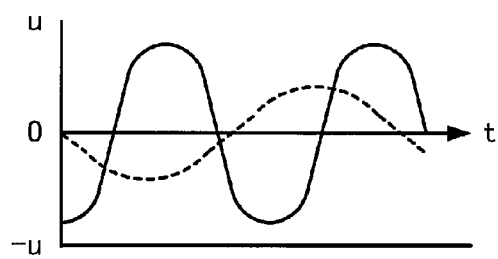
FIG. 6

POWER GENERATION UNIT, ELECTRONIC APPARATUS, TRANSPORTATION DEVICE, AND METHOD OF CONTROLLING POWER GENERATION UNIT

BACKGROUND

1. Technical Field

The present invention relates to a power generation unit for taking out the charge, which is generated when a piezoelectric material such as a piezoelectric element is deformed due to an external force, as electrical energy, a method of controlling the power generation unit, an electronic apparatus and a transportation device including the power generation unit.

2. Related Art

When a piezoelectric material such as lead zirconium titanate (PZT), quartz crystal ($SiO_2$), or zinc oxide (ZnO) is deformed, electrical polarization is induced inside the material, and positive and negative charges appear on the surface. Such a phenomenon is called a so-called piezoelectric effect. There has been proposed a power generation method of vibrating deforming member such as a cantilever to thereby make a weight repeatedly act on the piezoelectric material, and thus taking out the charge generated on the surface of the piezoelectric material as electricity using such a characteristic the piezoelectric material has.

For example, by vibrating a metal cantilever having a mass disposed at the tip and a thin plate made of the piezoelectric material bonded thereto, and taking out the positive and negative charges generated on the piezoelectric material due to the vibration, an alternating current is generated. Then, the alternating current is rectified by diodes, and then stored in a capacitor, and then taken out as electricity. Such a technology has been proposed in JP-A-7-107752 (Document 1). Further, there has been also proposed a technology of arranging that a junction is closed only in the period during which the positive charges are generated in a piezoelectric device to thereby make it possible to obtain a direct current without causing a voltage loss in the diodes (JP-A-2005-312269 (Document 2)). Since there is a possibility of downsizing the power generation unit by using these technologies, an application of, for example, incorporating the power generation unit in, for example, a small-sized electronic component instead of a battery.

In the power generation unit using such technologies, when a force stronger than the assumed force is applied to the cantilever to thereby excessively swing the cantilever, the cantilever might collide with a peripheral member to thereby be damaged. In order to prevent the above, there has been proposed a technology of providing an elastic body to an inside wall of a housing for housing the cantilever to thereby absorb the impact caused when the cantilever collides with the inside wall of the housing (JP-A-2003-218418 (Document 3)).

However, in the technology proposed in Document 3, since it is required to prepare a space for disposing the elastic body, there is a problem that it is difficult to sufficiently miniaturizing the power generation unit.

SUMMARY

An advantage of some aspects of the invention is to provide a technology capable of the miniaturization while suppressing the excessive swing of the deforming member in the power generation unit incorporating the deforming member and using the piezoelectric effect of the piezoelectric material.

(1) An aspect of the invention is directed to a power generation unit including a deforming member adapted to deform while switching a deformation direction, a piezoelectric device provided to the deforming member, and having a pair of electrodes, a displacement sensor adapted to detect a deformation amount of the deforming member, and then output deformation amount information as information related to the deformation amount, an inductor electrically connected to the piezoelectric device, a switch disposed between the piezoelectric device and the inductor, and a switch control section adapted to control the switch so as to set the pair of electrodes to a shorted state for a predetermined period of time when the deformation amount exceeds a predetermined level.

(2) In the power generation unit described above, in a period in which the deformation amount is lower than the predetermined level, the switch control section may set the switch to a connected state when the deformation direction of the deforming member is switched, and then set the switch to a disconnected state when a time period corresponding to a half cycle of a resonance period calculated using a capacitive component of the piezoelectric device and an inductance of the inductor.

In the power generation devices having the configurations described above, since the piezoelectric device is provided to the deforming member, the piezoelectric device is deformed in accordance with the deformation of the deforming member. As a result, positive and negative charges are generated in the piezoelectric device due to the piezoelectric effect. If the piezoelectric device is deformed repeatedly together with the deforming member, the positive and negative charges are also generated repeatedly, and by taking out the charges as a current, the power generation is performed. Further, when the deformation amount exceeds a predetermined value, the pair of electrodes of the piezoelectric device is set to the shorted state. Since the piezoelectric device has a property of hardly deforming in the state of shorting the pair of electrodes, according to the operation described above, the deformation of the piezoelectric device can be reduced. Since the deforming member provided with the piezoelectric device can also be inhibited from being excessively deformed, it is not required to provide a member for absorbing the impact at the time of collision, and it becomes possible to miniaturize the power generation unit.

Here, the power generation units having the configurations described above are provided with a displacement sensor for detecting the deformation amount of the deforming member and then output the deformation amount information as the information related to the deformation amount. It is possible for the switch control section to figure out the deformation amount of the deforming member based on the deformation amount information from the displacement sensor. Therefore, it is possible to surely inhibit the deforming member from being excessively deformed.

Further, the generation amount of the charge of the piezoelectric device increases as the deformation amount of the piezoelectric device increases. In the power generation units having the configurations described above, the piezoelectric device constitutes the resonant circuit together with the inductor, and the resonant circuit is provided with a switch. Further, it is possible to, for example, start the deformation of the deforming member in the state in which the conduction in the switch is cut, and set the switch to the conduction state when the deformation amount reaches an extreme value (i.e., the deformation direction is switched). Since the piezoelectric device deforms with the deforming member, and generates more charge as the deformation amount increases, when the charge generated in the piezoelectric device reaches the maximum value, the piezoelectric device is connected to the inductor to thereby form the resonant circuit. Then, the charges generated in the piezoelectric device flows into the inductor. Then, since the piezoelectric device and the inductor forms the resonant circuit, the current having flown into the inductor overshoots, and then flows into the terminal on the opposite side of the piezoelectric device. This period (i.e., the period until the charge flown out from one terminal of the piezoelectric device flows again into the piezoelectric device through the other terminal via the inductor) is a half of the resonance period of the resonant circuit composed of the piezoelectric device and the inductor. Therefore, by forming the resonant circuit by setting the switch to the connected state when the deformation direction of the piezoelectric device is switched, and then setting the switch to the disconnected state when the time period a half as long as the resonance period has elapsed, it is possible to reverse the locations of the positive and negative charges having been generated in the piezoelectric device before connecting the inductor. Then, by deforming the deforming member in turn in the opposite direction from that state, the piezoelectric device is also deformed in the opposite direction, and therefore, the charges are accumulated in the piezoelectric device in such a manner that the new charges further generated by the piezoelectric effect in the state in which the locations of the positive and negative charges are reversed are stacked incrementally thereon. Further, since the voltage generated also increases as the charges are stored in the piezoelectric device, it is possible to generate a voltage higher than the voltage generated by the electrical polarization of the piezoelectric material forming the piezoelectric device without additionally preparing a step-up circuit.

Here, the power generation units having the configurations described above are capable of figuring out, for example, the displacement due to the deformation of the deforming member as the deformation amount information. The switch control section can figure out the switching (i.e., the switching of the deformation direction of the piezoelectric device) of the direction of the displacement of the deforming member based on the accurate displacement detected by the displacement sensor. Further, the switch control section sets the switch to the conduction state from the switching of the deformation direction of the piezoelectric device for a predetermined period of time to thereby make it possible to efficiently store the charges in the piezoelectric device.

As described above, the switch is also set to the connected state at the timing for reducing the deformation amount of the piezoelectric device. Therefore, by controlling the connection timing of the switch based on the deformation amount information, it becomes possible to generate the high voltage as described above in addition to the reduction of the deformation amount of the piezoelectric device.

(3) In the power generation unit according to the above aspect of the invention, the deformation amount information may correspond to a magnitude of a displacement due to the deformation of the deforming member, and the switch control section may control the switch to set the pair of electrodes to the shorted state for a predetermined period of time when the magnitude of the displacement exceeds a predetermined threshold value.

(4) In the power generation unit according to the above aspect of the invention, the deformation amount information may correspond to a magnitude of a displacement due to the deformation of the deforming member, and the switch control section may perform second-order differentiation on the magnitude of the displacement to thereby obtain an acceleration, and control the switch to set the pair of electrodes to the shorted state for a predetermined period of time when a level of the acceleration exceeds a predetermined threshold level.

According to the power generation units having the configurations described above, the switch control section receives the displacement due to the deformation of the deforming member as the deformation amount information from the displacement sensor. Since the displacement sensor is capable of directly (i.e., instead of obtaining it by converting the variation in voltage or current in the circuit) detecting the deformation of the deforming member, the deformation amount information thus generated is accurate. The displacement can be expressed in such a manner that, for example, the state in which no force acts on the deforming member corresponds to zero, the case of deforming in one direction (e.g., upward) corresponds to a positive value, and the case of deforming in the other direction (e.g., downward) corresponds to a negative value.

Further, the switch control section can determine that the deformation amount of the deforming member is equal to or larger than a predetermined value in the case in which the magnitude of the displacement is equal to or greater than a predetermined threshold value. On this occasion, it is possible to set the pair of electrodes of the piezoelectric device to the shorted state to thereby reduce the deformation of the piezoelectric device. Therefore, it is not required to provide the member for absorbing the impact at the time of the collision, and thus, it becomes possible to miniaturize the power generation unit.

Further, the switch control section can perform the second-order differentiation on the displacement to thereby obtain the acceleration, and then determine that the deformation amount of the deforming member is equal to or larger than a predetermined value in the case in which the level of the acceleration is equal to or greater than a predetermined threshold level. On this occasion, it is possible to detect or predict the state in which the deforming member has excessively swung based on the level of the acceleration. Further, it is possible to set the pair of electrodes of the piezoelectric device to the shorted state to thereby reduce the deformation of the piezoelectric device. It should be noted that it is also possible for the switch control section to set the pair of electrodes of the piezoelectric device to the shorted state in the case in which at least either one of the condition that the magnitude of the displacement is equal to or larger than a predetermined threshold value, and the condition that the level of the acceleration is equal to or higher than a predetermined threshold level is fulfilled.

(5) In the power generation unit according to the above aspect of the invention, the displacement sensor may be of an eddy current type.

(6) In the power generation unit according to the above aspect of the invention, the displacement sensor may be of an optical type.

(7) In the power generation unit according to the above aspect of the invention, the displacement sensor may be of an ultrasonic type.

(8) In the power generation unit according to the above aspect of the invention, the displacement sensor may be of a capacitance type.

According to the configurations described above, by selecting a specific type as the displacement sensor, the detection accuracy can be improved. As the displacement sensor, there is used a contactless sensor not hindering the deformation of the piezoelectric device. Further, there are a variety of types of contactless sensors such as an optical type, an ultrasonic type, an eddy current type, and a capacitance type. Among these sensors, the eddy current sensor includes a detection coil for generating a high-frequency magnetic field. Further, since an eddy current (an induction current due to the electromagnetic induction) flows through the detection object when the detection object comes closer, the impedance of the detection coil varies. The displacement can be measured based on the variation in the impedance. On the other hand, the optical sensor includes a light emitting element and an optical position detection element. Further, light (e.g., a laser beam) is emitted from the light emitting element toward the detection object. The surface-reflected light from the detection object passes through a light receiving lens, and forms a spot on the optical position detection element. The displacement can be measured based on the variation in the position of the spot. The eddy current sensor and the optical sensor have a high response frequency compared to those of the rest of the types. Therefore, by using the eddy current sensor or the optical sensor as the displacement sensor, it is possible to accurately capture the timing of the switching of the deformation direction of the piezoelectric device.

Further, the displacement sensor can be of the ultrasonic type or the capacitance type. The ultrasonic displacement sensor emits an ultrasonic wave, and then receives the ultrasonic wave reflected by the target object. It is possible to accurately obtain the distance with a relatively simple and easy calculation based on the time between the emission and the reception. Further, the capacitance displacement sensor measures the displacement based on the variation in the capacitance, and is therefore capable of measuring a minute displacement.

(9) Another aspect of the invention is directed to a method of controlling a power generation unit including a deforming member adapted to deform while switching a deformation direction, a piezoelectric device provided to the deforming member, a displacement sensor adapted to detect a deformation amount of the deforming member, and then output deformation amount information as information related to the deformation amount, an inductor electrically connected to the piezoelectric device, and a switch disposed between the piezoelectric device and the inductor. The method includes: acquiring the deformation amount information, and controlling the switch to set the piezoelectric device and the inductor to a shorted state for a predetermined period of time when the deformation amount exceeds a predetermined value.

The method of controlling a power generation unit according to this aspect of the invention includes the acquiring of the deformation amount information from the displacement sensor, and the controlling of the switch so as to set the pair of electrodes of the piezoelectric device to the shorted state based on the deformation amount information. Firstly, it is possible to obtain the direct and accurate information of the displacement of the deforming member detected by the displacement sensor as the deformation amount information. Therefore, the accurate deformation amount information with little error can be obtained. Further, in the step of controlling the switch, it is possible to surely inhibit the deforming member from being excessively deformed based on such accurate deformation amount information.

(10) Still another aspect of the invention is directed to an electronic apparatus including any one of the power generation units described above.

(11) Yet another aspect of the invention is directed to a transportation device including any one of the power generation units described above.

These aspects of the invention relate to a compact electronic device such as a remote controller incorporating the power generation unit described above instead of a battery, and the transportation device such as a vehicle or an electric train equipped with the power generation unit described above. The electronic apparatus can generate the electrical power due to the vibration caused therein when, for example, being transported or used. In the electronic apparatus, an operation such as battery change is eliminated. Further, it is possible for the transportation device (e.g., a vehicle and an electric train) to generate electricity due to the vibration caused transportation, and then efficiently supply, for example, the equipment provided to the transportation device with the electricity.

BRIEF DESCRIPTION OF THE DRAWINGS

The invention will be described with reference to the accompanying drawings, wherein like numbers reference like elements.

FIGS. 5A through 5C are explanatory diagrams showing a reason that a switch can be controlled at appropriate timing by detecting the displacement.

FIG. 6 is an explanatory diagram showing the displacement of a beam when applying a vibration to the beam.

DESCRIPTION OF AN EXEMPLARY EMBODIMENT

Hereinafter, embodiments of the invention will be explained along the following order to thereby clarify the content of the invention described above.

A. Embodiment

A-1. Structure of Power Generation Unit
A-2. Operation of Power Generation Unit

Figure 1A:
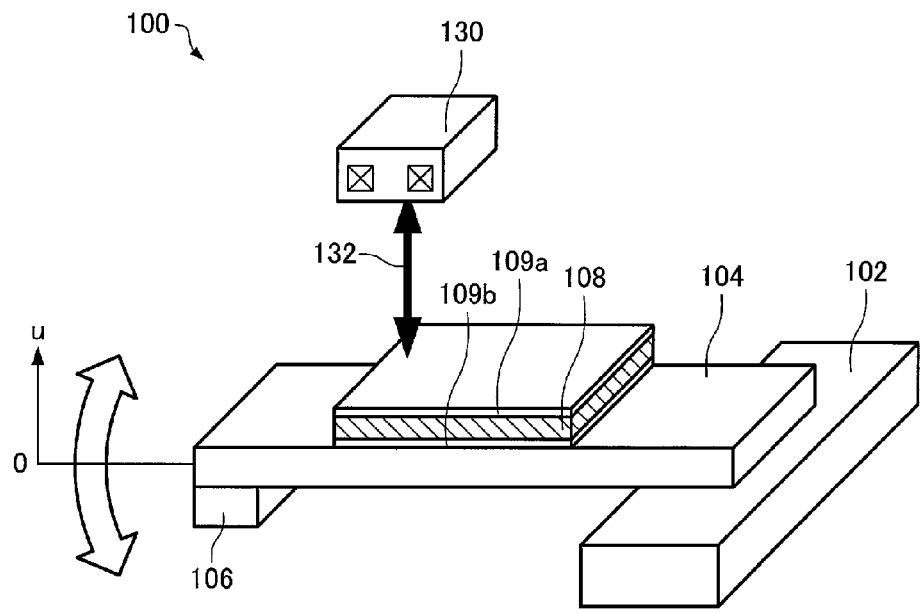
FIGS. 1A and 1B are explanatory diagrams showing a structure of a power generation unit according to an embodiment of the invention.
Figure 1B:
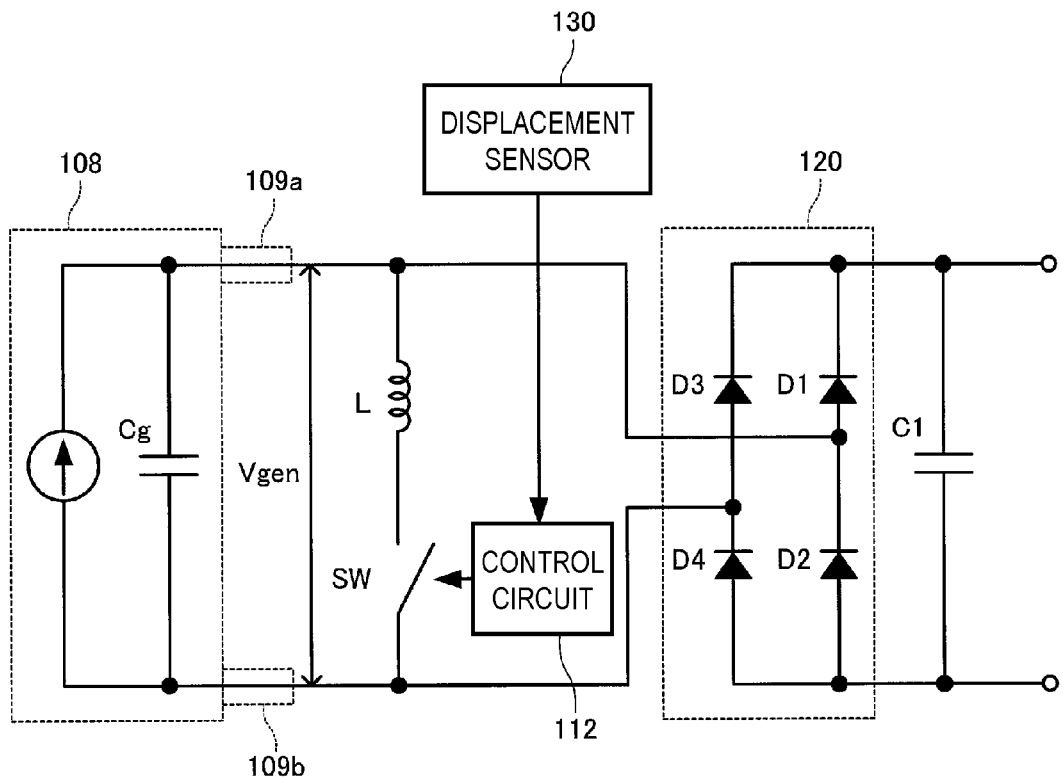

A-3. Operation Principle of Power Generation Unit
A-4. Switching Timing of Switch
A-5. Displacement Sensor
B. First Modified Example
C. Second Modified Example
D. Third Modified Example
E. Others A. Embodiment A-1. Structure of Power Generation Unit FIGS. 1A and 1B are explanatory diagrams showing a structure of a power generation unit 100 according to the present embodiment. FIG. 1A shows a mechanical structure of the power generation unit 100, and FIG. 1B shows an electrical structure thereof The mechanical structure of the power generation unit 100 according to the present embodiment is formed as a cantilever structure in which a beam 104 having a mass 106 disposed at the tip thereof is fixed to a base 102 on the base end side thereof, and the base 102 is preferably fixed inside the power generation unit 100. Further, on the surface of the beam 104 there is attached a piezoelectric element 108 formed of a piezoelectric material such as lead zirconium titanate (PZT), and on the surfaces of the piezoelectric element 108 there are disposed a first electrode 109a and a second electrode 109b each formed of a metal thin film respectively on the obverse side and the reverse side. The piezoelectric element 108, the first electrode 109a, and the second electrode 109b constitute a piezoelectric device. It should be noted that although in the example shown in FIG. 1A, the piezoelectric element 108 is disposed on the upper surface side of the beam 104, it is also possible to dispose the piezoelectric element 108 on the lower surface side of the beam 104, or it is also possible to dispose the piezoelectric elements 108 on both of the upper surface side and the lower surface side of the beam 104. Further, since the piezoelectric element 108 deforms due to the deformation of the beam 104, the beam 104 corresponds to the "deforming member" in the invention.

Since the beam 104 is fixed to the base 102 at the base end side thereof, and has the mass 106 disposed on the tip side thereof, when a vibration or the like is applied to the beam 104, the tip of the beam 104 vibrates with a large amplitude as indicated by an outlined arrow in the drawing. As a result, a compressive force and a tensile force alternately act on the piezoelectric element 108 attached to the beam 104. Then, the piezoelectric element 108 generates positive and negative charges due to the piezoelectric effect, and the charges appear in the first electrode 109a and the second electrode 109b. Further, although the mass 106 is not essential, it is desirable to create imbalance in mass between the tip side and the base end side of the beam 104. This is because the displacement of the beam 104 becomes easy to repeat in response to one vibration, for example, due to the imbalance in mass.

The displacement sensor 130 is fixed inside the power generation unit 100, and measures the displacement of the beam 104 as the deforming member. The displacement sensor 130 is preferably a contactless sensor, which does not hinder the deformation of the piezoelectric element 108, as is the case of the present embodiment. It should be noted that the detailed explanation with respect to the contactless sensor will be described later.

In the present embodiment, the displacement sensor 130, which is a contactless sensor, is disposed so as to be opposed to the surface (the upper surface) of the beam 104 on which the piezoelectric element 108 is disposed. Further, the displacement sensor 130 measures the distance 132 between a measurement position in the upper surface of the beam 104 and the displacement sensor 130.

It is preferable for the displacement sensor 130 to measure the displacement of the tip side of the beam 104 for accurate displacement detection. This is because the tip side of the beam 104 vibrates with a larger amplitude in response to application of a vibration compared to the base end side thereof. On the other hand, there is a possibility that there occurs the different in vibration between the part where the piezoelectric element 108 is attached and the other part in the upper surface of the beam 104. Therefore, in order for figuring out the deformation of the piezoelectric element 108, it is preferable to measure the displacement of the part where the piezoelectric element 108 is attached. Therefore, the displacement sensor 130 in the present embodiment is disposed so as to be opposed to the upper surface of the beam 104, and measures the distance 132 from the p art corresponding to the tip side of the beam 104 out of the part where the piezoelectric element 108 is attached.

It should be noted that the displacement sensor 130 can also be disposed so as to be opposed to the lower surface of the beam 104. However, in this case, if it is attempt to measure the tip side of the beam 104, the mass 106 with a larger thickness may intervene or fail to intervene between the displacement sensor 130 and the beam 104, and thus, the accurate measurement might be hindered. Therefore, if the displacement sensor 130 is disposed so as to be opposed to the lower surface of the beam 104, there occurs the possibility that the measurement must be performed while avoiding the tip portion of the beam 104. Therefore, it is preferable that the displacement sensor 130 is disposed so as to be opposed to the upper surface of the beam 104.

Further, although the explanation is presented assuming that the distance 132 is measured by the displacement sensor 130 at the measurement position of the upper surface of the beam 104, it is also possible that the beam 104 is provide with an object displacement of which can be measured, and measure the displacement of the object, or it is also possible to use a side surface and so on of the beam 104 depending on the installation condition of the power generation unit 100 and the type of the displacement sensor.

FIG. 1B shows an example of the circuit of the power generation unit 100 according to the present embodiment. The piezoelectric element 108 can electrically be expressed as a current source and a capacitor Cg for storing a charge. An inductor L is connected in parallel to the piezoelectric element 108 to thereby form an electrical resonant circuit together with the capacitive component (the capacitor Cg) of the piezoelectric element 108. Further, a switch SW for switching ON/OFF the resonant circuit is connected in series to the inductor L. A control circuit 112 (corresponding to a switch control section) controls ON/OFF of the switch SW. Further, the first electrode 109a and the second electrode 109b provided to the piezoelectric element 108 are connected to a full bridge rectifier 120 composed of four diodes D1 through D4. Further, a capacitor (a capacitor C1) for storing the current after the rectification for driving an electrical load is connected to the full bridge rectifier 120.

Here, the control circuit 112 determines the timing of switching ON the switch SW based on the information of the displacement of the beam 104 from the displacement sensor 130. Therefore, as described later, it is possible to correctly capture the magnitude of the deformation amount and the switching timing of the deformation direction of the piezoelectric device, and it is possible to enhance the effect of preventing the excessive deformation of the deforming member and the step-up effect.

A-2. Operation of Power Generation Unit

Figure 2A:
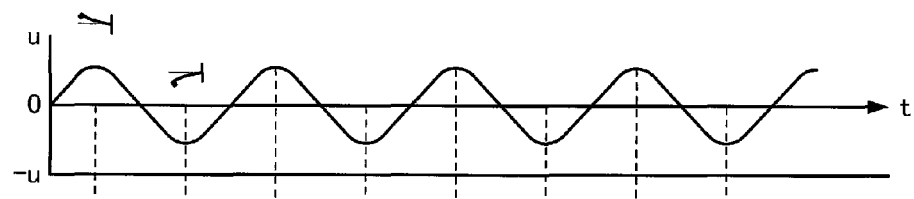
FIGS. 2A through 2D are explanatory diagrams showing an operation of the power generation unit according to the embodiment.
Figure 2B:
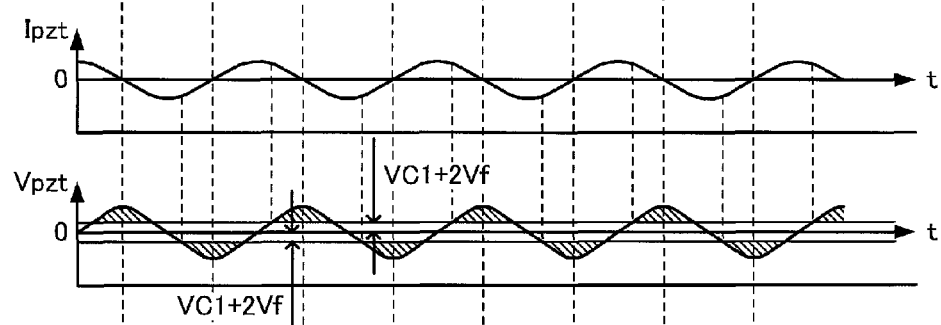

FIGS. 2A through 2D are explanatory diagrams showing the operation of the power generation unit 100 according to the present embodiment. FIG. 2A shows the displacement of the tip of the beam 104 due to the vibration of the beam 104. It should be noted that the positive displacement (u) represents the state (the state in which the upper surface of the beam 104 has a concave shape) in which the beam 104 is warped upward, and the negative displacement (−u) represents the state (the state in which the lower surface of the beam 104 has a concave shape) in which the beam 104 is warped downward. Further, FIG. 2B shows the state of the current generated by the piezoelectric element 108 due to the deformation of the beam 104 and the electromotive force caused inside the piezoelectric element 108 as a result thereof. It should be noted that in FIG. 2B the state of the charge generated in the piezoelectric element 108 is expressed as an amount of the charge (i.e., a current Ipzt) generated per unit time, and the electromotive force generated in the piezoelectric element 108 is represented as the electrical potential difference Vpzt generated between the first electrode 109a and the second electrode 109b.

As shown in FIGS. 2A and 2B, during the period in which the displacement of the beam 104 keeps increasing, the piezoelectric element 108 generates a current in the positive direction (i.e., the current Ipzt takes a positive value), and the electrical potential difference Vpzt between the first electrode 109a and the second electrode 109b increases in the positive direction in conjunction therewith. If the electrical potential difference Vpzt in the positive direction exceeds the sum of the voltage VC1 of the capacitor C1 and a twofold of the forward voltage drop Vf of the diode constituting the full bridge rectifier 120, namely VC1+2Vf, the charge generated thereafter can be taken out as a direct current and stored in the capacitor C1. Further, during the period in which the displacement of the beam 104 keeps decreasing, the piezoelectric element 108 generates a current in the negative direction (i.e., the current Ipzt takes a negative value), and the electrical potential difference Vpzt between the first electrode 109a and the second electrode 109b increases in the negative direction in conjunction therewith. If the electrical potential difference Vpzt in the negative direction exceeds the sum of VC1 and 2Vf of the full bridge rectifier 120, the charge generated can be taken out as a direct current and stored in the capacitor C1. In other words, even when keeping the switch SW shown in FIG. 1B in the OFF state, the charge can be stored in the capacitor C1 regarding the part indicated by hatching in FIG. 2B.

Figure 2C:
Figure 2D:
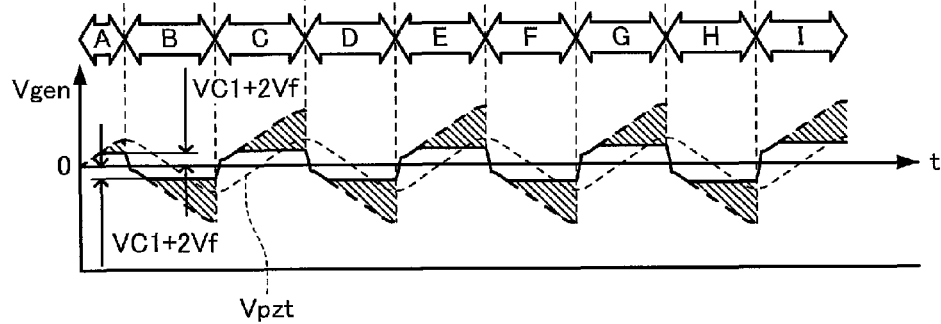

In the power generation unit 100 according to the present embodiment, the switch SW is set to the ON state at the timing shown in FIG. 2C. Then, as shown in FIG. 2D, there occurs a phenomenon in which the voltage waveform between the terminals (hereinafter described as "between the terminals of the piezoelectric element 108") of the piezoelectric device including the piezoelectric element 108 is changed as if it is shifted when the switch SW is set to the ON state. In other words, in the period B indicated as "B" in FIG. 2D, a voltage waveform indicated by the thick dotted line, which is a voltage waveform changed as if the voltage waveform Vpzt indicated by the thin dotted line corresponding to the electromotive force of the piezoelectric element 108 is shifted toward the negative side, appears between the terminals of the piezoelectric element 108. The reason that such a phenomenon occurs will be described later. Further, in the period C indicated as "C" in FIG. 2D, there appears a voltage waveform indicated by the thick dotted line modified as if the voltage waveform Vpzt corresponding to the electromotive force of the piezoelectric element 108 is shifted toward the positive side. Similarly, thereafter, in each of the period D, the period E, the period F, and so on, there appears a voltage waveform indicated by the thick dotted line modified as if the voltage waveform Vpzt corresponding to the electromotive force of the piezoelectric element 108 is shifted toward the positive side or the negative side. Further, in the part (the part indicated by hatching in FIG. 2D) where the voltage waveform thus shifted exceeds the sum of VC1 and 2Vf, the charge generated in the piezoelectric element 108 can be stored in the capacitor C1. It should be noted that as a result of the flow of the charge from the piezoelectric element 108 to the capacitor C1, the voltage between the terminals of the piezoelectric element 108 is clipped at the voltage corresponding to the sum of VC1 and 2Vf. As a result, the waveform indicated by the thick solid line in FIG. 2D is obtained as the voltage waveform of the voltage between the first electrode 109a and the second electrode 109b.

As is obvious from the comparison between the case of keeping the switch SW in the OFF state shown in FIG. 2B and the case of setting the switch SW to the ON state at the timing when the deformation direction of the beam 104 is switched shown in FIG. 2D, in the power generation unit 100 according to the present embodiment, it becomes possible to efficiently store the charge in the capacitor C1 by setting the switch SW to the ON state at appropriate timing.

Further, if the charge is stored in the capacitor C1 and the inter-terminal voltage of the capacitor C1 increases, the shift amount of the voltage waveform also increases in accordance therewith. For example, in comparison between the period B (the state in which no charge is stored in the capacitor C1) in FIG. 2D and the period H (the state in which the charge is stored a little bit in the capacitor C1) in FIG. 2D, the shift amount of the voltage waveform is larger in the period H. Similarly, in comparison between the period C and the period I in FIG. 2D, the shift amount of the voltage waveform is larger in the period I in which the charge stored in the capacitor C1 is increased. Although the reason why such a phenomenon occurs will be described later, as a result, in the power generation unit 100 according to the present embodiment, it becomes possible to store the voltage higher than the voltage Vpzt, which is generated between the first electrode 109a and the second electrode 109b by deforming the piezoelectric element 108, in the capacitor C1. As a result, it becomes unnecessary to provide an additional step-up circuit, and thus it becomes possible to obtain a small-sized and highly efficient power generation unit.

A-3. Operation Principle of Power Generation Unit

Figure 3A:
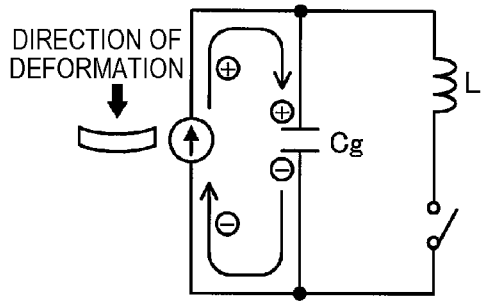
FIGS. 3A through 3F are explanatory diagrams conceptually showing an anterior half of the operation principle of the power generation unit according to the embodiment.

FIGS. 3A through 3F are explanatory diagrams conceptually showing an anterior half of the operation principle of the power generation unit 100 according to the present embodiment. Further, FIGS. 4A through 4F are explanatory diagrams conceptually showing a posterior half of the operation principle of the power generation unit 100 according to the present embodiment. FIGS. 3A through 3F and 4A through 4F conceptually show the movement of the charge in the capacitor Cg (the capacitive component of the piezoelectric element 108) when setting the switch SW to the ON state in accordance with the deformation of the piezoelectric element 108. FIG. 3A shows the state in which the piezoelectric element 108 (the beam 104 to be precise) is deformed upward (so that the upper surface has a concave shape). If the piezoelectric element 108 is deformed upward, the current in the positive direction flows from the current source, then the charge is stored in the capacitor Cg, and the voltage in the positive direction is generated as the voltage Vgen. The voltage value increases as the deformation of the piezoelectric element 108 increases. Then, the switch SW is set to the ON state at the timing (the timing at which the amount of the charge reaches the maximum value; see FIG. 3B) at which the deformation of the piezoelectric element 108 reaches the maximum value.

Figure 3F:
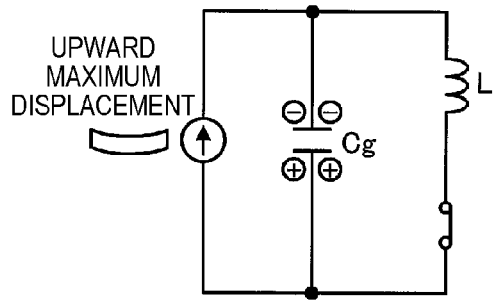
Figure 3F:
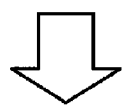
Figure 3F:
Figure 3B:
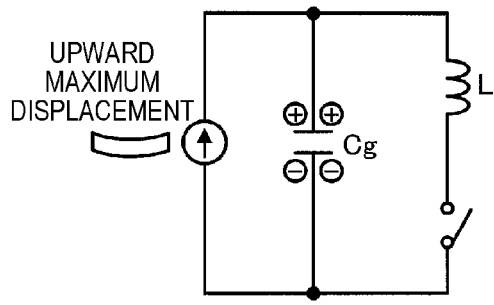
Figure 3E:
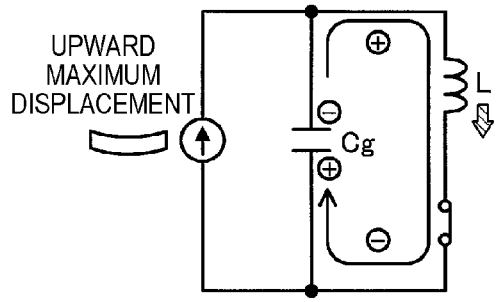
Figure 3E:
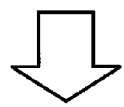
Figure 3E:
Figure 3C:
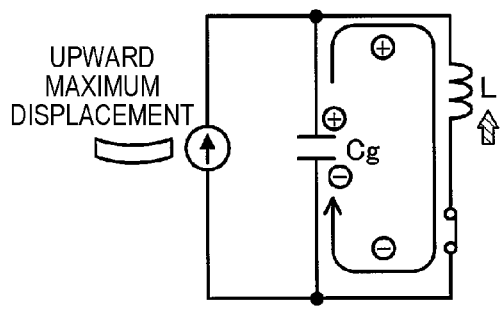

FIG. 3C shows the state immediately after setting the switch SW to the ON state. Since the charge is stored in the capacitor Cg, the charge is urged to flow into the inductor L. Although a magnetic flux is generated (the magnetic flux increases) when a current flows through the inductor L, the inductor L has a nature (a self-induction effect) of generating a back electromotive force in the direction of preventing the change in the magnetic flux penetrating the inductor itself Since the magnetic flux is urged to increase due to the charge flowing therethrough when the switch SW is set to the ON state, the back electromotive force occurs in the direction (in other words, the direction of hindering the flow of the charge) of preventing the magnetic flux from increasing. Further, the level of the back electromotive force is proportional to the variation rate (the variation per unit time) of the magnetic flux. In FIG. 3C, the back electromotive force generated in the inductor L in such a manner as described above is indicated by the arrow provided with hatching. Since such a back electromotive force occurs, only a little amount of the charge in the piezoelectric element 108 flows out when setting the switch SW to the ON state. In other words, the current flowing through the inductor L increases only gradually.

Figure 3D:
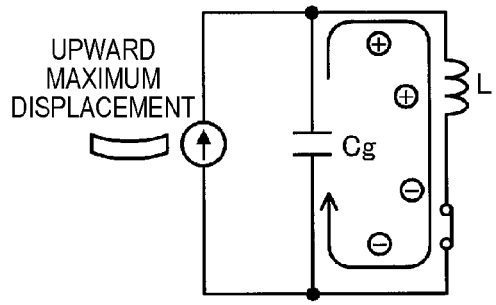
Figure 3D:
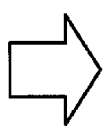

Subsequently, when the current flowing through the inductor L reaches a peak value, the variation rate of the magnetic flux reaches "0," and therefore, the back electromotive force reaches "0" as shown in FIG. 3D. Then, the current starts decreasing in turn. Then, since the magnetic flux penetrating the inductor L decreases, the electromotive force occurs in the inductor L in the direction (the direction of urging the current to flow) of preventing the decrease in the magnetic flux (see FIG. 3E). As a result, the current continues to flow through the inductor L while pulling out the charge from the capacitor Cg due to the electromotive force. Then, if no loss occurs during the migration of the charge, all the charge generated by the deformation of the piezoelectric element 108 is migrated, and there occurs the state (i.e., the state in which the positive charge is distributed on the lower surface side of the piezoelectric element 108, and the negative charge is distributed on the upper surface side) looked as if the positive and negative charges are replaced with each other. FIG. 3F shows the state in which all the charge generated by the deformation of the piezoelectric element 108 has been migrated.

If the switch SW is kept in the ON state without change, a converse phenomenon to the content described above occurs in turn. Specifically, the positive charge on the lower surface side of the piezoelectric element 108 is urged to flow into the inductor L, and at this moment, the back electromotive force in the direction of hindering the flow of the charge occurs in the inductor L. Subsequently, when the current flowing through the inductor L reaches the peak and then takes a downward turn, the electromotive force in the direction (the direction of urging the current to continue to flow) of preventing the current from decreasing occurs in turn in the inductor L. As a result, there occurs the state (the state shown in FIG. 3B) in which all the positive charge located on the lower surface side of the piezoelectric element 108 has been migrated to the upper surface side. In such a manner as described above, the positive charge having returned to the upper surface side of the piezoelectric element 108 is migrated again to the lower surface side in the manner described above with reference to FIGS. 3B through 3F.

As described above, if the switch SW is set to the ON state in the state in which the charge is stored in the capacitor Cg and is then kept in the ON state, there occurs a kind of resonant phenomenon in which the direction of the current is reversed alternately between the piezoelectric element 108 and the inductor L. Further, the period of the resonant phenomenon corresponds to the resonance period T of the so-called LC resonant circuit, and is therefore obtained by the formula T=2π(LC)0.5, assuming that the value (capacitance) of the capacitor Cg (the capacitive component) included in the piezoelectric element 108 is C, the value (inductance) of the inductive component of the inductor L is L. Therefore, the time immediately after (the state shown in FIG. 3C) setting the switch SW to the ON state until the state shown in FIG. 3F occurs is obtained as T/2.

Figure 4A:
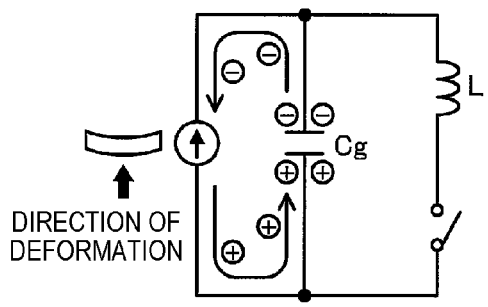
FIGS. 4A through 4F are explanatory diagrams conceptually showing a posterior half of the operation principle of the power generation unit according to the embodiment.
Figure 4F:
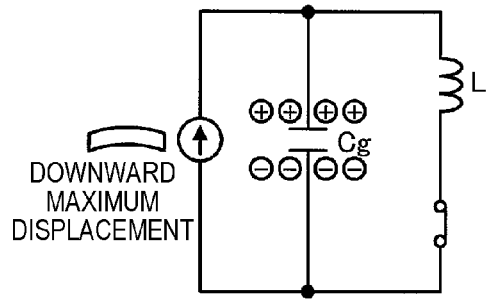
Figure 4F:
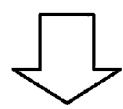
Figure 4F:
Figure 4B:
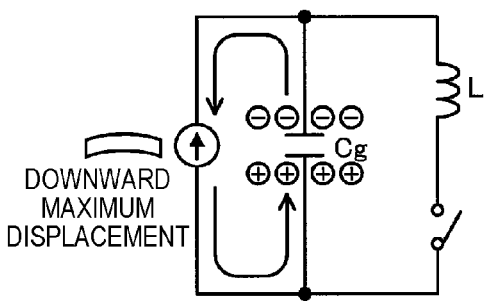
Figure 4E:
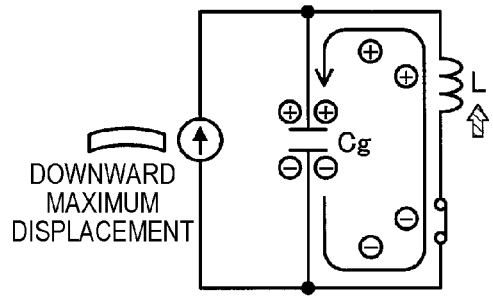
Figure 4E:
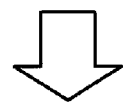
Figure 4E:
Figure 4C:
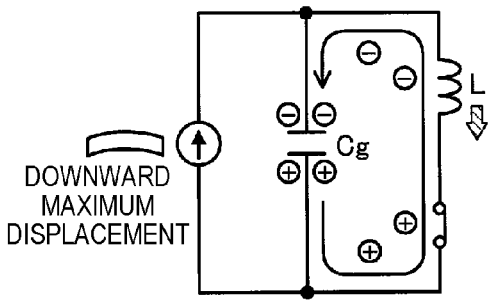
Figure 4D:
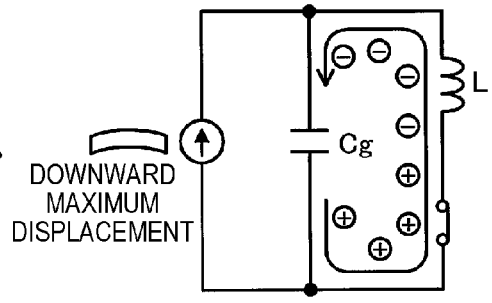

Therefore, the switch SW is set to the OFF state as shown in FIG. 4A at the time point when T/2 has elapsed after setting the switch SW to the ON state. Then, the piezoelectric element 108 (the beam 104 to be precise) is in turn deformed downward (so that the lower surface has a concave shape) from the present state. Although the piezoelectric element 108 is deformed upward in FIG. 3A described above, the piezoelectric element 108 is deformed downward in FIG. 4A, and therefore, the current flows from the current source in the negative direction, and the charge is stored in the capacitor Cg so that the voltage Vgen increases toward the negative side. Further, since the positive charge is distributed on the lower surface side of the piezoelectric element 108 and the negative charge is distributed on the upper surface side in the stage prior to deforming the piezoelectric element 108 (the beam 104 to be precise) downward as described above with reference to FIGS. 3A through 3F, it results that a new positive charge is stored on the lower surface side and a new negative charge is stored on the upper surface side in addition to these charges. FIG. 4B shows the state in which the new charges are stored in the piezoelectric element 108 by deforming the piezoelectric element 108 (the beam 104 to be precise) in the state of setting the switch SW to the OFF state.

Then, when setting the switch SW to the ON state at the timing (the timing at which the amount of the charge reaches the extreme value) at which the amount of deformation of the piezoelectric element 108 reaches the extreme value, the positive charge stored on the lower surface side of the piezoelectric element 108 is urged to flow into the inductor L. At this moment, since the back electromotive force occurs in the inductor L (see FIG. 4C), the current starts flowing gradually, and eventually reaches the peak, and then decreases. Then, the electromotive force occurs in the inductor L in the direction (the direction of urging the current to continue to flow) of preventing the current from decreasing (see FIG. 4E), and the current continues to flow due to the electromotive force. Eventually, all the positive charge having been distributed on the lower surface side of the piezoelectric element 108 is migrated to the upper surface side, and there occurs the state in which all the negative charge having been distributed on the upper surface side has been migrated to the lower surface side (see FIG. 4F). Further, the time necessary for migrating all the positive charge on the lower surface side to the upper surface side and migrating all the negative charge on the upper surface side to the lower surface side is equal to the time T/2 corresponding to a half cycle of the LC resonant circuit. Therefore, by setting the switch SW to the OFF state when the time T/2 has elapsed after setting the switch SW to the ON state, and then deforming in turn the piezoelectric element 108 (the beam 104 to be precise) upward (so that the upper surface has a concave shape), the positive and negative charges can further be stored in the piezoelectric element 108.

As explained above, in the power generation unit 100 according to the present embodiment, by deforming the piezoelectric element 108 to thereby generate the charge, and then connecting the piezoelectric element 108 to the inductor L to thereby form the resonant circuit for a half cycle of the resonance period, the distributions of the positive and negative charges in the piezoelectric element 108 are reversed. Subsequently, the piezoelectric element 108 is in turn deformed in the opposite direction to thereby generate new charges. Since the distributions of the positive and negative charges in the piezoelectric element 108 have been reversed, it results that the charges newly generated are stored in the piezoelectric element 108. Subsequently, the piezoelectric element 108 is connected again to the inductor L for a half cycle of the resonance period to thereby reverse the distributions of the positive and negative charges in the piezoelectric element 108, and then the piezoelectric element 108 is deformed in the opposite direction. By repeating such operations, it is possible to increase the charge stored in the piezoelectric element 108 every time the piezoelectric element 108 is deformed in a repeated manner.

It should be noted that due to the resonance of the LC resonant circuit, by setting the switch SW to the OFF state at least when the polarity of the voltage Vgen is changed to the opposite polarity to the polarity thereof at the time point when the switch SW is set to the ON state, the voltage Vgen continues to rise. Although in the explanation described above (and the explanation hereinafter described) "T/2 (a half of the resonance period)" is adopted for the sake of convenience, the time is not limited thereto, but it is possible to efficiently raise the voltage Vgen by setting the predetermined period during which the switch SW is set to the ON state to the time at least longer than $(n+\frac{1}{4})T$ and shorter than $(n+\frac{3}{4})T$ (n denotes an arbitrary integer equal to or greater than 0) with respect to the resonance period T of the LC resonant circuit.

As described above with reference to FIGS. 2A through 2D, in the power generation unit 100 according to the present embodiment, the phenomenon of shifting the voltage waveform between the terminals of the piezoelectric element 108 occurs every time the switch SW is set to the ON state. Specifically, in the period A shown in FIG. 2D, for example, although the voltage is generated between the first electrode 109a and the second electrode 109b in accordance with the deformation of the piezoelectric element 108 (the beam 104 to be precise), since the first electrode 109a and the second electrode 109b are connected to the full wave rectifier 120, the charge corresponding to the part exceeding the voltage of the sum of VC1 and 2Vf flows into the capacitor C1 connected to the full wave rectifier 120. As a result, when setting the switch SW to the ON state at the time point when the deformation of the beam 104 reaches the maximum value, the positive and negative charges remaining in the piezoelectric element 108 at that moment are migrated via the inductor L, and the locations of the positive and negative charges in the piezoelectric element 108 are replaced with each other. It should be noted that as is obvious from the mechanism described above with reference to FIGS. 3A through 3F and 4A through 4F, the period during which the switch SW is kept in the ON state corresponds to a half of the resonance period of the resonant circuit composed of the capacitor of the piezoelectric element 108 and the inductor L.

Then, when deforming the beam 104 in the opposite direction from the state in which the locations of the positive and negative charges are replaced with each other, the voltage waveform due to the piezoelectric effect appears between the first electrode 109a and the second electrode 109b of the piezoelectric element 108. In other words, it results that the voltage change due to the deformation of the piezoelectric element 108 occurs in the state in which the polarities of the first electrode 109a and the second electrode 109b of the piezoelectric element 108 are replaced with each other. As a result, there appears in the period B shown in FIG. 2D the voltage waveform looked as if the voltage waveform generated in the piezoelectric element 108 due to the deformation of the beam 104 is shifted. However, as described above, since the charge corresponding to the part exceeding the voltage of the sum of VC1 and 2Vf flows into the capacitor C1, the voltage between the first electrode 109a and the second electrode 109b of the piezoelectric element 108 is clipped at the voltage of the sum of VC1 and 2Vf. Subsequently, when setting the switch SW to the ON state for the time a half as long as the resonance period, the locations of the positive and negative charges remaining in the piezoelectric element 108 are replaced with each other. Then, by the deformation of the beam 104 starting from that state, the voltage waveform due to the piezoelectric effect appears in the piezoelectric element 108. Therefore, it results that there appears also in the period C shown in FIG. 2D the voltage waveform looked as if the voltage waveform due to the deformation of the beam 104 is shifted.

Further, as described above with reference to FIGS. 2A through 2D, in the power generation unit 100 according to the present embodiment, there also occurs the phenomenon that the shift amount of the voltage waveform gradually increases as the beam 104 repeats the deformation. Therefore, there can be obtained a significant advantage that the voltage higher than the potential difference caused between the first electrode 109a and the second electrode 109b by the piezoelectric effect of the piezoelectric element 108 can be stored in the capacitor C1. Such a phenomenon is caused by the following mechanism.

Firstly, as shown in the period A or the period B in FIG. 2D, in the case in which the capacitor C1 has not been charged, since the charge flows from the piezoelectric element 108 into the capacitor C1 when the voltage generated between the terminals of the piezoelectric element 108 exceeds 2Vf of the full wave rectifier 120, the voltage appearing between the terminals of the piezoelectric element 108 is clipped at 2Vf. However, as the capacitor C1 is charged in such a manner as described above, the voltage between the terminals of the capacitor C1 increases. Then, thereafter, the charge does not flow into the capacitor C1 from the piezoelectric element 108 until the inter-terminal voltage of the piezoelectric element 108 reaches a voltage higher than the sum of VC1 and 2Vf. Therefore, the value at which the voltage between the terminals of the piezoelectric element 108 is clipped gradually rises as the charge stored in the capacitor C1 increases.

In addition, as described above with reference to FIGS. 3A through 3F and 4A through 4F, on the condition that the charge is prevented from flowing out from the piezoelectric element 108, the charges in the piezoelectric element 108 continues to increase every time the piezoelectric element 108 (the beam 104 to be precise) is deformed, and the voltage between the terminals of the piezoelectric element 108 rises in conjunction therewith. Therefore, according to the power generation unit 100 of the present embodiment, it becomes possible to generate the electrical power in the condition in which the voltage is automatically raised to the voltage necessary to drive the electrical load without providing an additional step-up circuit.

A-4. Switching Timing of Switch

As described hereinabove, in the power generation unit 100 according to the present embodiment, by applying the cyclic deformation to the piezoelectric element 108 (the beam 104 to be precise), and connecting the piezoelectric element 108 to the inductor L for a period of time a half as long as the resonance period when the deformation direction is switched, it is possible to obtain an excellent feature that miniaturization is easy because the efficiency is high, and in addition, no step-up circuit is required. However, it is not so easy to set the switch SW to the ON state when the deformation direction of the beam 104 is switched. For example, since the time point at which the deformation direction of the beam 104 is switched corresponds to the time point at which the magnitude of the displacement of the beam 104 reaches the maximum value, it is also possible to adopt the configuration of using a mechanical contact which is set to the ON state when the beam 104 takes the maximum displacement. However, if the adjustment of the contact fails, it results that the efficiency is dramatically degraded. Therefore, as shown in FIG. 1B, the power generation unit 100 according to the present embodiment the switch SW is controlled by the displacement sensor 130 as a contactless sensor detecting the displacement of the beam 104 in vibration.

FIGS. 5A through 5C are explanatory diagrams showing the reason that the switch SW can be controlled at appropriate timing by detecting the displacement of the beam 104 in vibration by the displacement sensor 130. FIG. 5A shows the displacement of the beam 104. Further, FIG. 5B shows the function f' obtained by temporally differentiating the function f representing the displacement. Here, it is assumed that the deformation amount information from the displacement sensor 130 can discretely be obtained. In this case, the differential value specifically corresponds to the difference value between the displacement f(n) at the sampling timing n and the displacement f(n−1) at the previous sampling timing.

As described above with reference to FIGS. 3A through 3F and 4A through 4F, the electrical power can be generated with the highest efficiency in the case of setting the switch SW to the ON state at the timing at which the displacement of the beam 104 reaches the extreme value. Further, as is obvious from the comparison between FIGS. 5A and 5B, the displacement of the beam 104 takes the extreme value at the timing at which the differential value reaches zero. In reality, since the deformation amount information from the displacement sensor 130 can discretely be obtained, it is possible to adopt the timing at which the sign of the differential value changes.

Therefore, as shown in FIG. 5B, the control circuit 112 detects the timing at which the sign changes from "+" to "−" or the timing at which the sign changes from "−" to "+," and then sets the switch SW to the ON state for the time period (T/2) of a half of the resonance period described above staring from the timing, and thus, it becomes possible to efficiently generate the electrical power.

In this case, since the beam 104 vibrates due to the external force, the magnitude (the amplitude) of the displacement of the vibration is diverse. However, in the present embodiment, the displacement of the beam 104 is detected using the displacement sensor 130 of the contactless type, and the control circuit 112 can accurately obtain the timing at which the displacement reaches the extreme value from the difference value based on the deformation amount information. In other words, the timing at which the displacement of the beam 104 reaches the extreme value can accurately be obtained regardless of the amplitude of the vibration.

Further, since it is sufficient for the control circuit 112 to detect only the inversion of the sign, reduction of the circuit size can be achieved. Specifically, the determination can be performed only by obtaining the displacement values f(n), f(n−1), and f(n−2) corresponding to the sampling timings up to the second previous one, and then comparing these values with each other.

Hereinabove, the fact that the electrical power can efficiently be generated by setting the switch SW to the ON state at the timing described above is explained. In the power generation unit 100 according to the present embodiment, it is possible to reduce the deformation amount of the beam 104 by setting the switch SW to the ON state at the timing explained hereinafter besides the timing described above.

FIG. 6 is an explanatory diagram showing the displacement of the beam 104 when applying a vibration to the beam 104. The deformation amount of the beam 104 (corresponding to the deforming member) can also be obtained by calculation based on, for example, the speed of the tip end of the beam 104 obtained as the deformation amount information, and the time. However, in the present embodiment, the displacement of the beam 104 varying due to the vibration can be obtained from the displacement sensor 130 as the deformation amount information. For example, the "magnitude" of the displacement of the beam 104 corresponds to the deformation amount of the deforming member in the invention.

The solid line shown in FIG. 6 indicates the displacement of the beam 104 (and the piezoelectric element 108) in the case of setting the switch SW to the OFF state, and the dotted line indicates the displacement of the beam 104 (and the piezoelectric element 108) in the case of setting the switch SW to the ON state, namely in the case in which the first electrode 109a and the second electrode 109b of the piezoelectric element 108 are in the shorted state. It should be noted that the same force is applied to the beam 104 in both of the case (the solid line) of setting the switch SW to the OFF state and the case (the dotted line) of setting the switch SW to the ON state shown in FIG. 6. As is obvious from the comparison between the dotted line and the solid line shown in FIG. 6, the deformation of the beam 104 (and the piezoelectric element 108) is reduced in the case of setting the switch SW to the ON state to thereby set the first electrode 109a and the second electrode 109b to the shorted state than in the case of setting the switch SW to the OFF state.

Figure 7A:
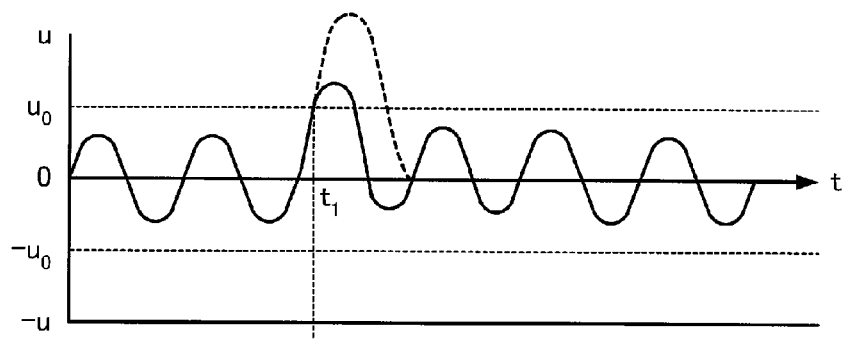
FIGS. 7A and 7B are explanatory diagrams showing how the deformation of the piezoelectric device is reduced by performing short-circuiting when the displacement detected exceeds a predetermined value.
Figure 7B:

FIGS. 7A and 7B are explanatory diagrams showing how the deformation of the piezoelectric element 108 (and the beam 104) is reduced by performing short-circuiting when the "magnitude" of the displacement of the beam 104 exceeds a threshold value based on the deformation amount information (the displacement due to the deformation of the beam 104) from the displacement sensor 130.

FIG. 7A shows the displacement of the beam 104 due to the vibration. As shown in FIG. 7A, the displacement reaches the threshold value $u_0$ at the timing $t_1$. Then, as shown in FIG. 7B, by setting the switch SW to the ON state at the timing $t_1$ to thereby set the first electrode 109a and the second electrode 109b of the piezoelectric element 108 for power generation to the shorted state, the deformation of the piezoelectric element 108 (and the beam 104) is reduced. Specifically, although it is assumed that the piezoelectric element 108 is significantly deformed as indicated by the dotted line in FIG. 7A unless the switch SW is set to the ON state, the deformation of the piezoelectric element 108 (and the beam 104) is reduced to the extent indicated by the solid line by setting the switch SW to the ON state.

As described above, since the deformation amount of the beam 104 can be controlled, it is possible to prevent the beam 104 from colliding with the members disposed in the periphery of the beam 104 and the housing. As a result, it becomes unnecessary to dispose a buffer for absorbing the impact of the collision, and it becomes possible to miniaturize the power generation unit 100.

Figure 8:
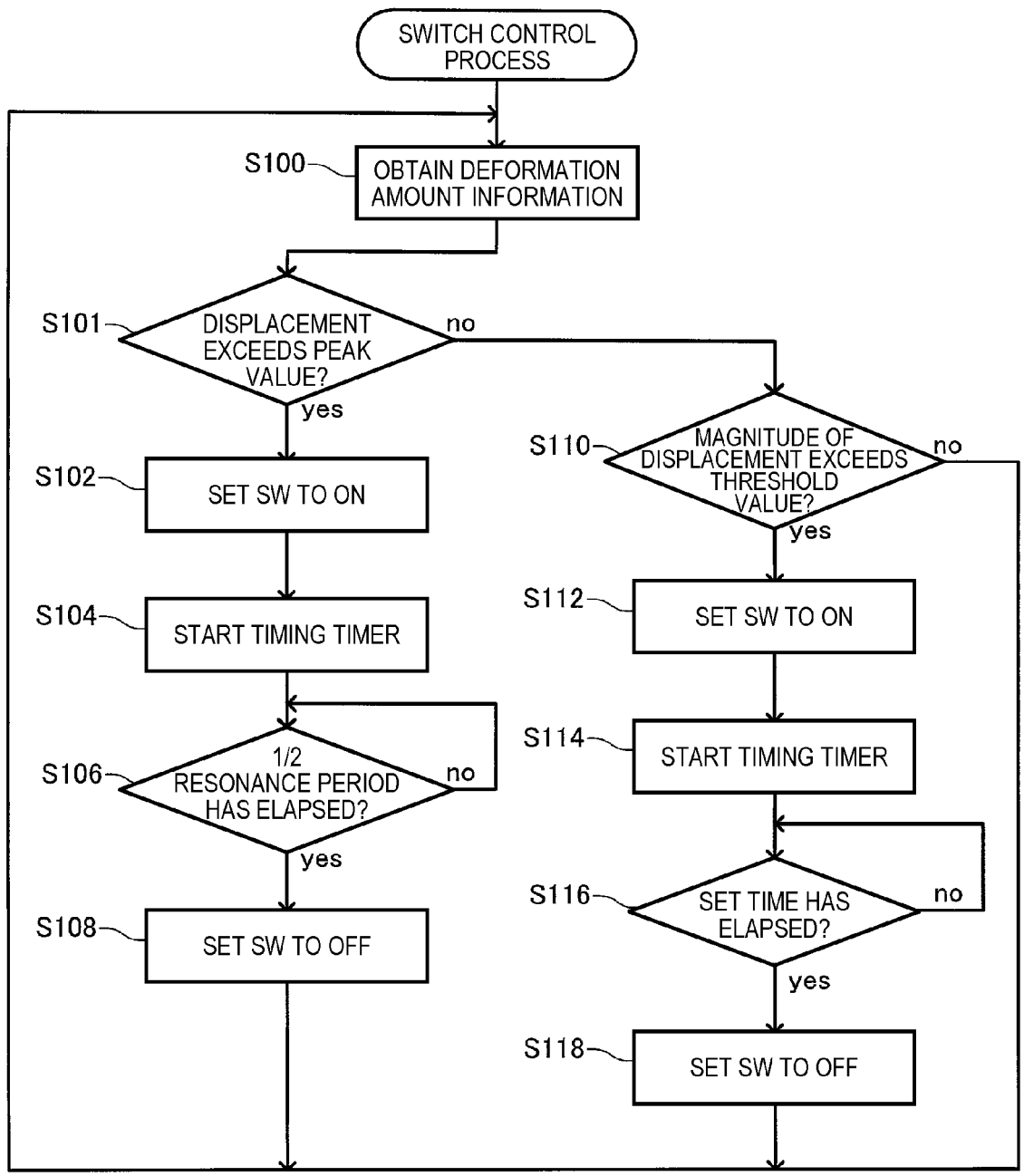
FIG. 8 is a flowchart showing a switch control process of switching between ON and OFF states of the switch based on the displacement detected.

FIG. 8 is a flowchart showing a switch control process of switching between the ON and OFF states of the switch SW.

This process is performed by a CPU incorporated in, for example, the control circuit 112. In this case, the CPU corresponds to a switch control section.

When the switch control process is started, the CPU of the control circuit 112 obtains the deformation amount information (step S100) representing the displacement of the beam 104 from the displacement sensor 130. Then, the CPU determines (step S101) whether or not the displacement of the beam 104 has reached the peak (the extreme value) based on the deformation amount information. As described above, whether or not the displacement of the beam 104 has reached the peak can be determined based on the change in the sign of the differential value.

If the peak of the displacement of the beam 104 is detected in such a manner as described above (YES in the step S101), the switch SW of the resonant circuit (the resonant circuit composed of the capacitor Cg of the piezoelectric element 108 and the inductor L) is set to the ON state (step S102), and then a timing timer not shown incorporated in the control circuit 112 is started (step S104). Then, whether or not the time a half as long as the resonance period of the resonant circuit composed of the capacitor Cg of the piezoelectric element 108 and the inductor L has elapsed is determined (step S106).

As a result, if it is determined that the time a half as long as the resonance period has not yet elapsed (NO in the step S106), the same determination is repeatedly performed to thereby continue the standby state until the time a half as long as the resonance period elapses. Then, if it is determined that the time a half as long as the resonance period has elapsed (YES in the step S106), the switch SW of the resonant circuit is set to the OFF state (step S108).

Since the switch SW can easily be set to the ON or OFF state at appropriate timings in accordance with the motion of the beam 104 by setting the switch SW of the resonant circuit to the ON or OFF state through the process of the steps S100 through S108 described above, it becomes possible to efficiently generate the electrical power using the power generation unit 100. After setting the switch SW of the resonant circuit to the OFF state (step S108), the process returns to the top of the switch control process, and the series of process described above is performed again.

If the peak of the displacement of the beam 104 fails to be detected in the process of the step S101 (NO in the step S101), then whether or not the magnitude of the displacement of the beam 104 is equal to or greater than the threshold value is determined (step S110). As a result, if the magnitude of the displacement of the beam 104 is equal to or greater than the threshold value (YES in the step S110), the switch SW is set to the ON state (step S112) so as to short the first electrode 109a and the second electrode 109b to thereby reduce the deformation of the beam 104. Subsequently, the timing timer incorporated in the control circuit 112 is started (step S114). Then, whether or not a set period of time has elapsed is determined (step S116). Here, the set period of time denotes the time for shorting the first electrode 109a and the second electrode 109b to thereby reduce the deformation of the beam 104. As the length of the set period of time, there is set the time of, for example, about a half of the resonance period of the beam 104, with which the deformation of the beam 104 can sufficiently be reduced.

If it is determined that the set period of time has not yet elapsed in the process of the step S116 (NO in the step S116), the same determination is repeatedly performed to thereby continue the standby state until the set period of time elapses. Then, if it is determined that the set period of time has elapsed (YES in the step S116), the switch SW is set to the OFF state (step S118). After setting the switch SW to the OFF state, or the magnitude of the displacement of the beam 104 has not yet reached the threshold value (NO in the step S110), the process returns to the top of the switch control process, and the series of process described above is performed again.

By performing the process of the steps S110 through S118 described above, the unexpected deformation of the beam 104 can be inhibited by shorting the first electrode 109a and the second electrode 109b for the set period of time in the case in which the deformation amount of the beam 104 exceeds a predetermined magnitude. As a result, since the beam 104 can be prevented from colliding the members disposed in the periphery of the beam 104 and the housing, and it becomes unnecessary to dispose the buffer for absorbing the impact of the collision, it becomes possible to miniaturize the power generation unit 100.

Further, it becomes possible to efficiently generate the electrical power by controlling the timing for setting the single switch SW to the ON state (steps S100 through S108), and moreover, the deformation amount of the beam 104 can be reduced (steps S110 through S118). In other words, since the switch SW provided for efficiently generating the electrical power is also used for reducing the deformation amount of the beam 104, it becomes possible to inhibit the number of members constituting the power generation unit 100 from increasing.

A-5. Displacement Sensor

In the present embodiment, a contactless sensor is used as the displacement sensor 130. Since the contactless sensor is used, it is possible to make the control circuit 112 appropriately determine the peak of the vibration of the beam 104 with the diverse amplitude without hindering the deformation of the piezoelectric device.

Here, there are a variety of types of contactless sensors such as an optical type, an ultrasonic type, an eddy current type, and a capacitance type. The displacement of the beam 104 can be measured by any type of sensor. However, by using the eddy current type or the optical type each having a high response frequency, the detection accuracy can be improved. For example, some of the eddy current type or optical type sensors have a response frequency of several kHz to several tens kHz while the ultrasonic type or capacitance type sensors have a response frequency in a range of several tens Hz.

Figure 9A:
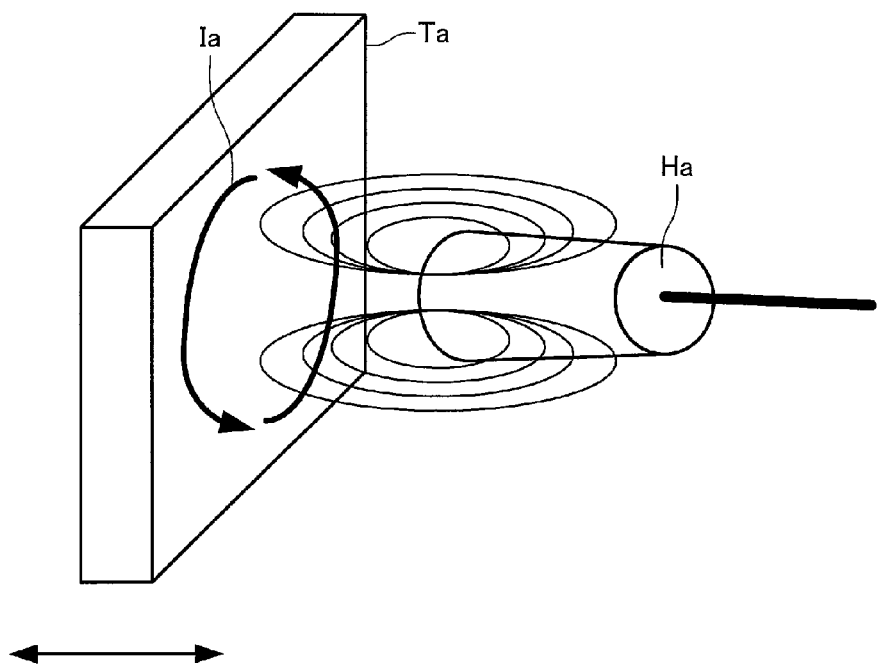
FIGS. 9A and 9B are explanatory diagrams of an eddy current sensor.
Figure 9B:
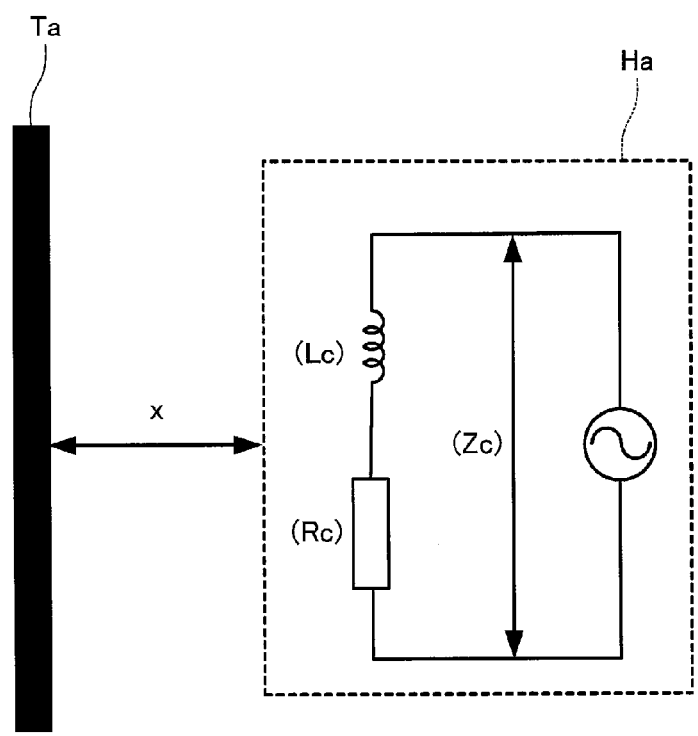

FIGS. 9A and 9B are explanatory diagram of an eddy current displacement sensor. FIG. 9A shows a head Ha of the displacement sensor and a detection object Ta. The detection object Ta moves back and forth against the head Ha.

The eddy current type sensor supplies a detection coil included in the head Ha with a high-frequency signal of, for example, several MHz. Then, a high-frequency magnetic field is generated from the detection coil in such a manner as shown in FIG. 9A. Then, when the detection object Ta made of metal comes closer, an eddy current Ia occurs on the surface of the metal. On this occasion, the level of the eddy current Ia varies in accordance with the distance between the head Ha (the detection coil) and the detection object Ta.

FIG. 9B shows an equivalent circuit of the detection coil of the head Ha. As shown in FIG. 9B, the equivalent circuit of the detection coil includes a resistor (having a resistance Rc) and an inductor (having an inductance Lc), and is supplied with a high-frequency signal. Here, the distance between the head Ha and the detection object Ta is defined by "x." In this case, the resistance Rc and the inductance Lc can be expressed as follows.

$Rc = R0 + \Delta R(x)$ $Lc = L0 + \Delta L(x)$

Here, R0, L0 are the values of the resistance Rc and the inductance Lc, respectively, with x taking an infinite value. When the distance x between the detection object Ta and the head Ha decreases, the eddy current Ia occurs to thereby make $\Delta R(x)$ and $\Delta L(x)$ have nonzero values. Since the eddy current Ia flows so as to generate a magnetic field canceling out the magnetic field surrounding the detection object Ta, $\Delta R(x)$ and $\Delta L(x)$ vary in accordance with the distance x. Then, it results that the impedance Zc of the detection coil of the head Ha also varies in accordance with the distance x.

The eddy current displacement sensor can obtain the distance x based on the variation in the impedance Zc of the detection coil. In other words, the eddy current displacement sensor can obtain the displacement of the detection object Ta.

Figure 10:
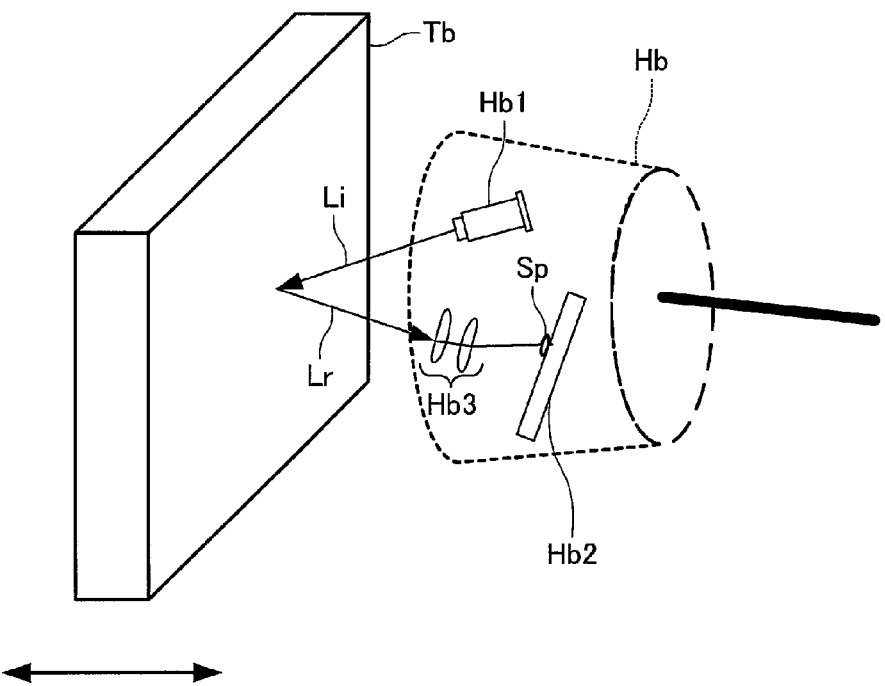
FIG. 10 is an explanatory diagram of an optical sensor.

FIG. 10 is an explanatory diagram of an optical displacement sensor. FIG. 10 shows a head Hb of the displacement sensor and a detection object Tb. The detection object Tb moves back and forth against the head Hb. The head Hb includes a light emitting element Hb1 and an optical position detection element Hb2. Further, light Li (e.g., a laser beam) is emitted from the light emitting element Hb1 toward the detection object Tb. The surface-reflected light Lr from the detection object passes through a light receiving lens Hb3, and forms a spot Sp on the optical position detection element Hb2. The optical displacement sensor can measure the displacement of the detection object Tb based on the variation in the position of the spot Sp.

Here, the eddy current displacement sensor uses the eddy current occurring on the surface of the metal. Therefore, the detection object (the beam 104 in the present embodiment) is limited to a conductive body such as metal. Therefore, if the beam 104 of the present embodiment is made of metal or coated with metal, the eddy current type sensor can be used as the displacement sensor 130. In other cases, the optical sensor can also be used as the displacement sensor 130.

It should be noted that the ultrasonic displacement sensor emits an ultrasonic wave from a sensor head, and then receives the ultrasonic wave reflected back from the target object (the beam 104 here). Then, the ultrasonic displacement sensor measures the time period from the emission of the ultrasonic wave to the reception thereof to thereby measure the distance (i.e., the displacement of the beam 104) from the beam 104. The distance LS from the beam 104 can be obtained by the following expression denoting the time period from the emission of the ultrasonic wave to the reception thereof by TS, and the sonic speed by CS.

$$LS=TS*CS/2$$

The distance LS can accurately be obtained with a relatively easy calculation. Further, the capacitance displacement sensor measures the displacement using the fact that the capacitance varies in inverse proportion to the distance between the electrodes. Therefore, a minute displacement can be measured.

B. First Modified Example

There exist a variety of modified examples in the present embodiment described above. Hereinafter, a first modified example will briefly be explained.

In the power generation unit 100 according to the embodiment described above, the explanation is presented assuming that there is provided the single piezoelectric element 108 for power generation. However, it is not necessarily required to provide the single piezoelectric element 108, but it is also possible to provide a plurality of piezoelectric elements.

Hereinafter, the first modified example with such a configuration will be explained. It should be noted that the constituents substantially the same as those of the embodiment described above will be attached with the same reference numerals in the modified examples, and the detailed explanation therefor will be omitted.

Figure 11:
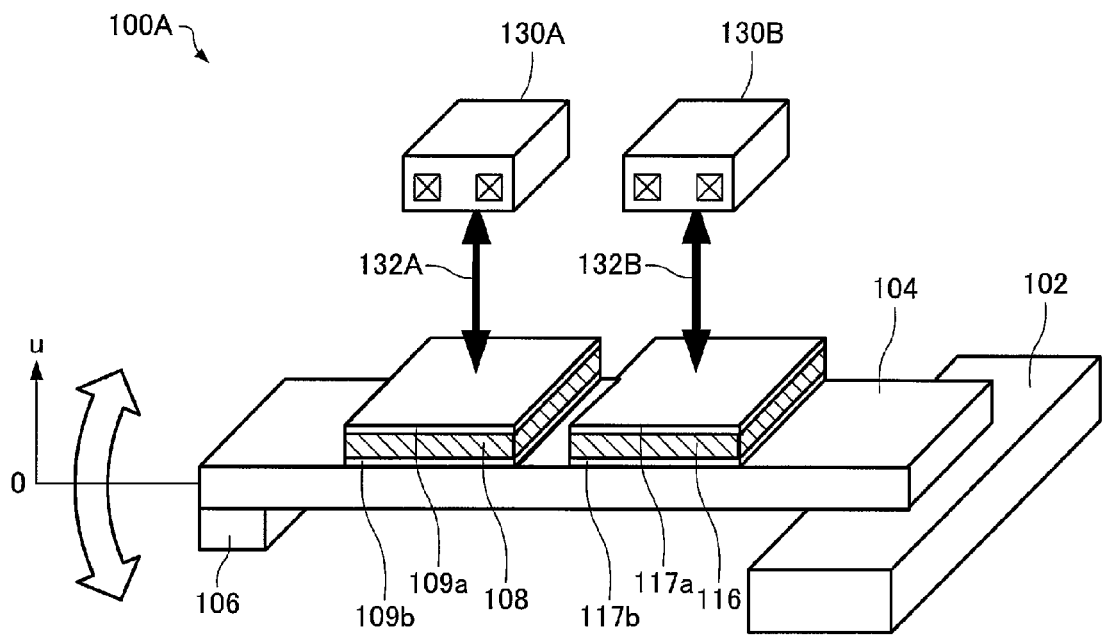
FIG. 11 is an explanatory diagram showing an arrangement of piezoelectric devices of a power generation unit according to a first modified example.

FIG. 11 is an explanatory diagram showing a power generation unit 100A according to the first modified example provided with a plurality of piezoelectric devices for power generation and displacement sensors therefor. As shown in FIG. 11, there are disposed two piezoelectric devices (a piezoelectric element 108 and a piezoelectric element 116) for power generation on one surface of the beam 104. The piezoelectric element 108 is the same as in the embodiment described above. Further, a first electrode 117a and a second electrode 117b each formed of a metal thin film are disposed respectively on an obverse side surface and a reverse side surface of the piezoelectric element 116. The piezoelectric element 116, the first electrode 117a, and the second electrode 117b constitute a piezoelectric device.

Further, as shown in FIG. 11, the displacement sensor 130A and the displacement sensor 130B, which are contactless sensors, are disposed so as to be opposed to the surface (the upper surface) of the beam 104 on which the piezoelectric element 108 and the piezoelectric element 116 are disposed. Further, the displacement sensor 130A and the displacement sensor 130B measure the distances 132A, 132B from the measurement positions on the upper surface of the beam 104, respectively. In the example shown in FIG. 11, the measurement positions for the displacement sensor 130A and the displacement sensor 130B are the portions of the beam 104 to which the piezoelectric element 108 and the piezoelectric element 116 are attached, respectively.

Here, although the piezoelectric element 108 and the piezoelectric element 116 for power generation are disposed on one surface of the beam 104 so as to be arranged in the longitudinal direction of the beam 104 in the example shown in FIG. 11, the arrangement is not limited thereto. For example, the piezoelectric elements 108, 116 can also be arranged in a direction intersecting with the longitudinal direction of the beam 104. Further, it is also possible to dispose the piezoelectric element 108 and the piezoelectric element 116 on the respective surfaces of the beam 104 different from each other. In this case, it is also possible to arrange that a single displacement sensor is provided, and measures only the distance from either one of the piezoelectric elements.

Figure 12:
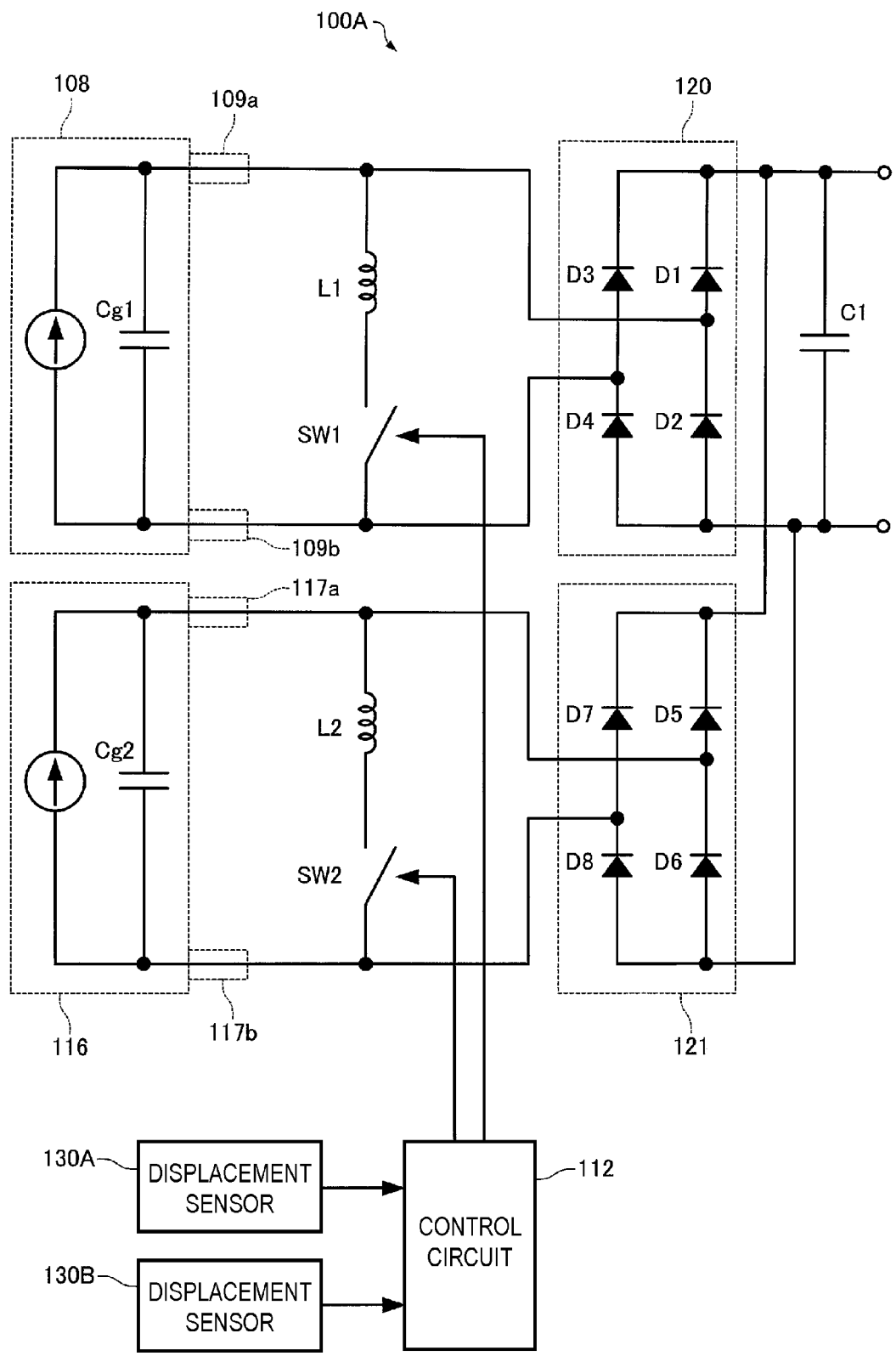
FIG. 12 is an explanatory diagram showing an electrical structure of the power generation unit according to the first modified example.

FIG. 12 is an explanatory diagram showing an electrical structure of the power generation unit 100A according to the first modified example provided with the two piezoelectric elements 108, 116 for power generation, and two displacement sensors 130A, 130B. An inductor L1, a switch SW1, and the displacement sensor 130A correspond respectively to the inductor L, the switch SW, and the displacement sensor 130 of the embodiment described above. As is obvious from the comparison between FIGS. 12 and 1B, the power generation unit 100A according to the first modified example is obtained by adding the piezoelectric element 116 for power generation, an inductor L2, a switch SW2, a full wave rectifier 121, the displacement sensor 130B, and so on to the embodiment described above. These constituents thus added function similarly to the piezoelectric element 108 for power generation, the inductor L, the switch SW, the full wave rectifier 120, the displacement sensor 130, and so on explained in the embodiment described above.

Specifically, by setting the switch SW1 to the ON state until the time a half as long as the resonance period has elapsed if the peak of the displacement based on the deformation amount information of the displacement sensor 130A is detected, the charges generated in the piezoelectric element 108 for power generation is efficiently stored in the capacitor C1. Similarly, by setting the switch SW2 to the ON state until the time a half as long as the resonance period has elapsed if the peak of the displacement based on the deformation amount information of the displacement sensor 130B is detected, the charges generated in the piezoelectric element 116 for power generation is also stored in the capacitor C1.

Further, similarly to the case of reducing the deformation of the piezoelectric element 108 for power generation by setting the switch SW1 to the ON state during the period from when the magnitude of the displacement based on the deformation amount information of the displacement sensor 130A exceeds the threshold value to when the set time has elapsed, the deformation of the piezoelectric element 116 for power generation is reduced by setting the switch SW2 to the ON state during the period from when the magnitude of the displacement based on the deformation amount information of the displacement sensor 130B exceeds the threshold value to when the set time has elapsed. By separately reducing the deformation of the piezoelectric elements 108, 116, it is possible to separately reduce the deformation of the separate portions of the beam 104 respectively provided with the piezoelectric elements 108, 116. As described above, since the deformation of the separate portions of the beam 104 is reduced separately, even if the excessive deformation occurs in one of the separate portions of the beam 104, the electrical power can be generated while reducing the deformation of only the one of the portions without reducing the deformation of the other of the portions. Therefore, it becomes possible to efficiently generate the electrical power while suppressing the excessive deformation in accordance with the diverse deformation of the beam 104.

C. Second Modified Example

Then, a second modified example will briefly be explained.

Figure 13:
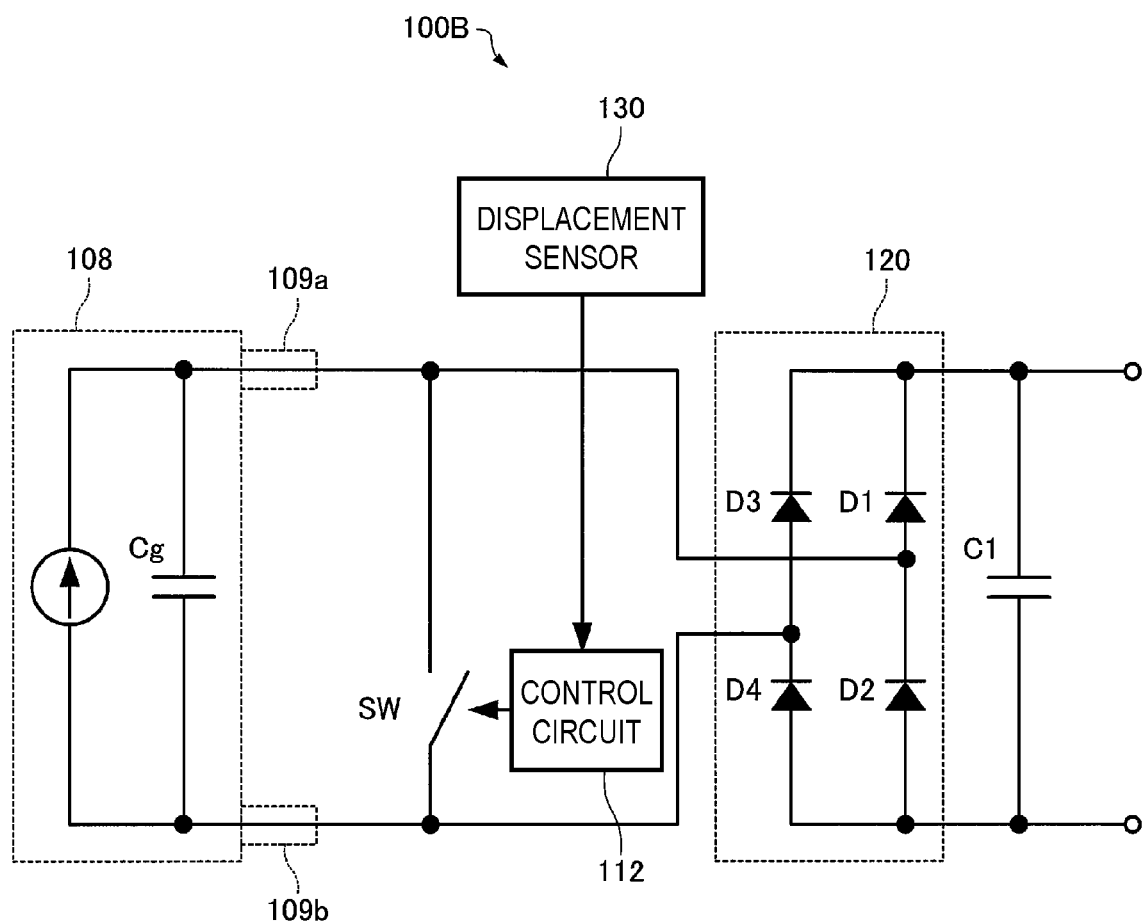
FIG. 13 is an explanatory diagram showing an electrical structure of a power generation unit according to a second modified example.

FIG. 13 is an explanatory diagram showing an electrical structure of a power generation unit 100B according to a second modified example. As is obvious from the comparison between FIGS. 13 and 1B, the power generation unit 100B according to the second modified example is obtained by eliminating the inductor L from the embodiment described above. In other words, such an LC resonant circuit as in the embodiment described above is not formed in the power generation unit 100B according to the second modified example. Thus, the control process (steps S101 through S108 in FIG. 8) for using the LC resonant circuit and performed by the CPU incorporated in the control circuit 112 can be eliminated.

Obviously, since the power generation unit 100B according to the second modified example does not use the LC resonant circuit unlike the power generation unit 100 according to the embodiment described above, such an efficient charge accumulation as in the power generation unit 100 according to the embodiment cannot be expected. However, by performing the process (steps S100 and S110 through S118 in FIG. 8) of setting the switch SW to the ON state when the deformation amount exceeds the predetermined value, the deformation of the beam 104 can be reduced. As described above, the power generation unit 100B according to the second modified example can prevent the beam 104 from colliding with the members disposed in the periphery of the beam 104 and the housing while suppressing the growth in the number of components (the inductor L) and the processing load of the CPU (the control process for using the LC resonant circuit).

D. Third Modified Example

Then, a third modified example will briefly be explained.

Figure 14A:
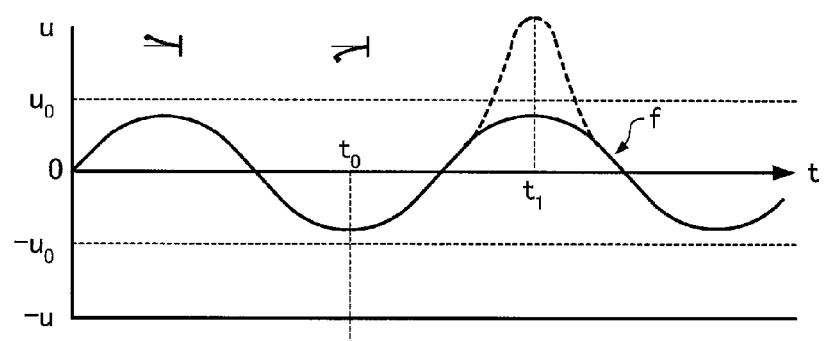
FIGS. 14A and 14B are diagrams for explaining the reason that a switch can be controlled at appropriate timing by obtaining an acceleration in a third modified example.
Figure 14B:
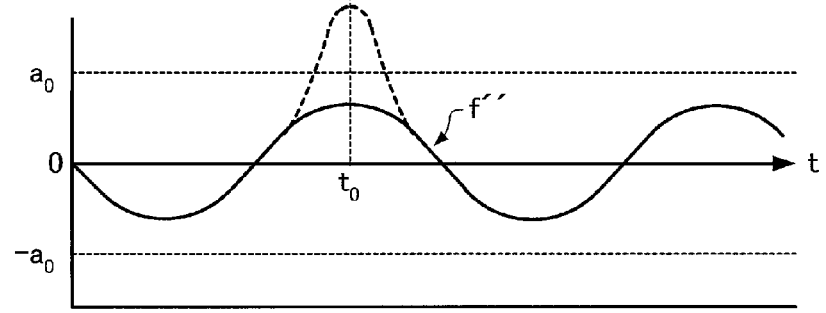

FIGS. 14A and 14B are diagrams for explaining the reason that the switch can be controlled at appropriate timing by obtaining an acceleration in the third modified example to thereby reduce the deformation of the beam 104. In the embodiment described above, the "magnitude" of the deformation of the beam 104 is obtained. Further, the switch control section determines that the deformation amount of the piezoelectric element 108 exceeds a predetermined value when the magnitude of the displacement is equal to or greater than the threshold value, and sets the first electrode 109$a$ and the second electrode 109$b$ to the shorted state to thereby suppress the deformation of the piezoelectric element 108.

In the third modified example, the acceleration of the beam 104 by the deformation is obtained from the displacement (the deformation amount information) of the beam 104, and it is determined that the deformation amount exceeds the predetermined value if the level of the acceleration is equal to or higher than a predetermined threshold value. In this case it is possible not only to detect the state in which the deformation amount of the piezoelectric element 108 has exceeded the predetermined level, but also to predict the state.

FIG. 14A shows the displacement of the beam 104. Further, FIG. 14B shows the function f'' obtained by performing a second-order temporal differentiation on the function f representing the displacement. The function f'' is a function representing the acceleration. If no strong external force is applied, the function f and the function f'' vary as indicated by the solid lines shown in FIGS. 14A and 14B.

However, it is assumed that a strong external force is applied upward at the timing $t_0$. On this occasion, the displacement of the beam 104 does not reach a level lower than the lower threshold value of $-u_0$. However, the upward acceleration increases as indicated by the dotted line to a level exceeding the threshold value $a_0$ of the acceleration. Then, it is deservingly predicted that the displacement of the beam 104 will exceed the threshold value $u_0$ of the displacement at the next local maximum value (timing $t_1$). At this moment, the switch control section of the third modified example sets the switch SW to the ON state at the timing $t_0$ at which the acceleration has exceeded the threshold value $a_0$ to thereby set the first electrode 109$a$ and the second electrode 109$b$ of the piezoelectric element 108 for power generation to the shorted state. Thus, it becomes possible to suppress the expected excessive deformation of the piezoelectric element 108 at the timing t1 in a preventive manner.

Here, it is assumed that the deformation amount information from the displacement sensor 130, for example, can discretely be obtained. In this case, the acceleration obtained by the second-order differentiation can specifically be expressed, for example, $f(n)-2f(n-1)+f(n-2)$ using the displacement $f(n)$ at the sampling timing n, and the displacement values $f(n-1)$, $f(n-2)$ at the previous and second previous sampling timings, respectively. Therefore, no complicated calculation is required.

It should be noted that although not shown in FIGS. 14A and 14B, if the magnitude of the displacement has exceeded the threshold value $u_0$ (e.g., the displacement indicated by the dotted line at $f(t_1)$ in FIG. 14A), the level of the acceleration corresponding thereto also exceeds the threshold value $a_0$. Therefore, in addition to the prediction, it is also possible to detect the state in which the deformation amount of the piezoelectric element 108 has exceeded the predetermined level.

E. Others

Although the embodiment and the modified examples are explained hereinabove, the invention is not limited to the embodiment and the modified examples described above, but can be put into practice in various forms within the scope or the spirit of the invention.

For example, in the embodiment described above the explanation is presented assuming that the switch SW is set to the ON state at the timing at which the deformation direction of the beam 104 is switched to thereby efficiently store the charges in the capacitor C1. However, the invention is not limited thereto, but the configuration of storing the charges to the capacitor C1 in the state of keeping the switch SW in the OFF state as shown in FIG. 2B can also be adopted. In other words, any configuration can be adopted providing the charges generated in the piezoelectric element 108 can be stored in some form.

Further, although in the embodiment described above, the explanation is presented assuming that the piezoelectric element 108 is attached to the beam 104 having the cantilever structure. However, the piezoelectric element 108 can be attached to any member providing the member is easily deformed in a repeated manner due to a vibration or the like. For example, the piezoelectric element 108 can be attached to a surface of a thin film, or to a side surface of a coil spring.

Further, if the ultracompact low power consumption displacement sensor 130 is available, such an application as to incorporate the power generation unit in a compact electronic device such as a remote controller instead of a battery. In this case, it is also possible to perform the control of supplying the energy stored in the capacitor C1 in the previous power generation to the displacement sensor 130 on a priority basis when using the compact electronic device.

It should be noted that although the power generation unit according to the embodiment of the invention can be miniaturized, the installation target is not limited to electronic apparatuses. For example, by applying the power generation unit according to the embodiment of the invention to a transportation device such as a vehicle or an electric train, it is also possible to generate power by the vibration due to the transportation, and to supply the electrical power efficiently to the equipment provided to the transportation device.

In this case, in order to cope with all of the vibrations, it is also possible to incorporate a plurality of power generation units 100 different in length of the beam 104 and weight of the mass 106 in the transportation device. In this case, it is also possible to constitute a power generating unit having the plurality of power generation units 100 fixed to the base 102 common to the power generation units 100.

Further, since the power generation unit according to the embodiment of the invention generates power in accordance with the vibration or the transportation, by installing the power generation unit on a bridge, a building, or a possible landslide place, it is also possible to generate electrical power at the time of disaster such as an earthquake, and to supply the electricity to a network device such as an electronic apparatus at only the time of need (disaster).

Further, the power generation unit according to the embodiment of the invention can be provided with the same shape as, for example, a button battery or a dry-cell battery, and can also be used in general electronic apparatuses instead of being installed in a specific electronic apparatus or the like. In this case, since it is possible to charge the capacitor by a vibration, the power generation unit can be used as a battery even in the time of disaster with electricity lost. In this case, since the life thereof is longer than that of a primary cell, reduction of environmental load can be achieved in terms of a life cycle.

This application claims priority to Japanese Patent Application No. 2011-219034, filed on Oct. 3, 2011, the entirety of which is hereby incorporated by reference.

What is claimed is:

1. A power generation unit comprising:
    a deforming member adapted to deform while switching a deformation direction;
    a piezoelectric device provided to the deforming member, and having a pair of electrodes;
    a displacement sensor adapted to detect a deformation amount of the deforming member, and then output deformation amount information as information related to the deformation amount;
    an inductor electrically connected to the piezoelectric device;
    a switch disposed between the piezoelectric device and the inductor; and
    a switch control section adapted to control the switch so as to set the pair of electrodes to a shorted state for a predetermined period of time when the deformation amount exceeds a predetermined level.

2. The power generation unit according to claim 1, wherein in a period in which the deformation amount is lower than the predetermined level, the switch control section sets the switch to a connected state when the deformation direction of the deforming member is switched, and then sets the switch to a disconnected state when a time period corresponding to a half cycle of a resonance period calculated using a capacitive component of the piezoelectric device and an inductance of the inductor.

3. The power generation unit according to claim 1, wherein the deformation amount information corresponds to a magnitude of a displacement due to the deformation of the deforming member, and
    the switch control section controls the switch to set the pair of electrodes to the shorted state for a predetermined period of time when the magnitude of the displacement exceeds a predetermined threshold value.

4. The power generation unit according to claim 1, wherein the deformation amount information corresponds to a magnitude of a displacement due to the deformation of the deforming member, and
    the switch control section performs second-order differentiation on the magnitude of the displacement to thereby obtain an acceleration, and controls the switch to set the pair of electrodes to the shorted state for a predetermined period of time when a level of the acceleration exceeds a predetermined threshold level.

5. The power generation unit according to claim 1, wherein the displacement sensor is of an eddy current type.

6. The power generation unit according to claim 1, wherein the displacement sensor is of an optical type.

7. The power generation unit according to claim 1, wherein the displacement sensor is of an ultrasonic type.

8. The power generation unit according to claim 1, wherein the displacement sensor is of a capacitance type.

9. A battery comprising the power generation unit according to claim 1.

10. A battery comprising the power generation unit according to claim 2.

11. A battery comprising the power generation unit according to claim 3.

12. A battery comprising the power generation unit according to claim 4.

13. An electronic apparatus comprising the power generation unit according to claim 1.

14. An electronic apparatus comprising the power generation unit according to claim 2.

15. An electronic apparatus comprising the power generation unit according to claim 3.

16. An electronic apparatus comprising the power generation unit according to claim 4.

17. A transportation device comprising the power generation unit according to claim 1.

18. A transportation device comprising the power generation unit according to claim 2.

19. A transportation device comprising the power generation unit according to claim 3.

20. A method of controlling a power generation unit including

- a deforming member adapted to deform while switching a deformation direction,
- a piezoelectric device provided to the deforming member,
- a displacement sensor adapted to detect a deformation amount of the deforming member, and then output deformation amount information as information related to the deformation amount,
- an inductor electrically connected to the piezoelectric device, and
- a switch disposed between the piezoelectric device and the inductor, the method comprising:

acquiring the deformation amount information; and controlling the switch to set the piezoelectric device and the inductor to a shorted state for a predetermined period of time when the deformation amount exceeds a predetermined value.

* * * * *